United States Patent

Sekiguchi et al.

[11] Patent Number: 5,886,943
[45] Date of Patent: Mar. 23, 1999

[54] SEMICONDUCTOR MEMORY HAVING A HIERARCHICAL DATA LINE STRUCTURE

[75] Inventors: Tomonori Sekiguchi, Kokubunji; Kiyoo Itoh, Higashi-kurume, both of Japan

[73] Assignee: Hitachi, Ltd., Tokyo, Japan

[21] Appl. No.: 931,528

[22] Filed: Sep. 16, 1997

[30] Foreign Application Priority Data

Sep. 18, 1996 [JP] Japan ................................. 8-245931

[51] Int. Cl.⁶ ............................................. G11C 5/06
[52] U.S. Cl. ................................. 365/230.03; 365/63
[58] Field of Search .............................. 365/230.03, 63, 365/206, 207, 189.01

[56] References Cited

U.S. PATENT DOCUMENTS

| | | | |
|---|---|---|---|
| 5,367,488 | 11/1994 | An ........................................ | 365/189.01 |
| 5,495,440 | 2/1996 | Asakura ............................... | 365/230.03 |
| 5,561,626 | 10/1996 | Fujii ...................................... | 365/230.03 |
| 5,600,602 | 2/1997 | Seggedy .............................. | 365/230.03 |
| 5,610,871 | 3/1997 | Hidaka ................................. | 365/230.03 |
| 5,682,343 | 10/1997 | Tomishima et al. ................ | 365/230.03 |

FOREIGN PATENT DOCUMENTS 6-12862  1/1994  Japan .
7-211059 8/1995  Japan .

OTHER PUBLICATIONS

J.H. Ahn et al, "Bidirectional Matched Global Bit Line Scheme for High Density DRAMs", 1993 Symposium on VLSI Circuits Digest of Technical Papers, 1993, pp. 91–92.
Kyoo Itoh, "Ultra–LSI Memory", published by Baifukan, 1994, pp. 191–237.

Primary Examiner—Tan T. Nguyen
Attorney, Agent, or Firm—Fay, Sharpe, Beall, Fagan, Minnich & McKee

[57] ABSTRACT

An increase in a dynamic random access memory (DRAM) chip area is minimized by dividing data lines into multiple sections, arranging global data lines parallel to the data lines and placing them in a hierarchical structure. The switches connecting the data lines and the global data lines are arranged separately or in alternate positions to further reduce the chip area. The influence of noise due to the length of data lines is reduced. Sense amplifier drive circuits are controlled to selectively apply voltages to the sense amplifiers depending upon the length of the path from each sense amplifier to a particular memory cell.

39 Claims, 23 Drawing Sheets

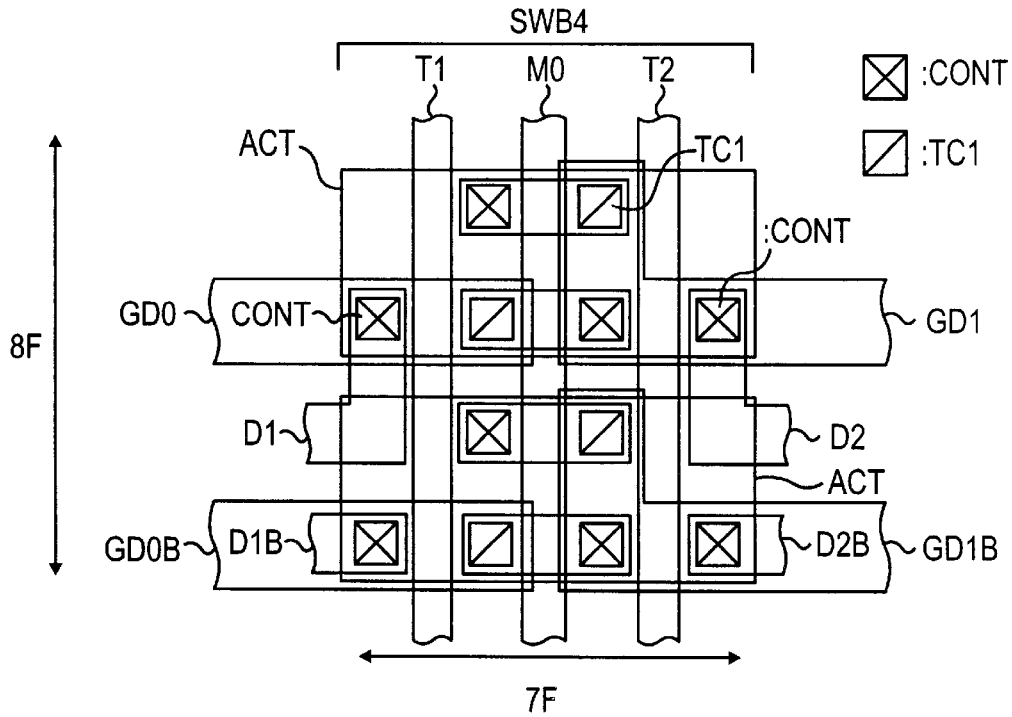
FIG. 18A
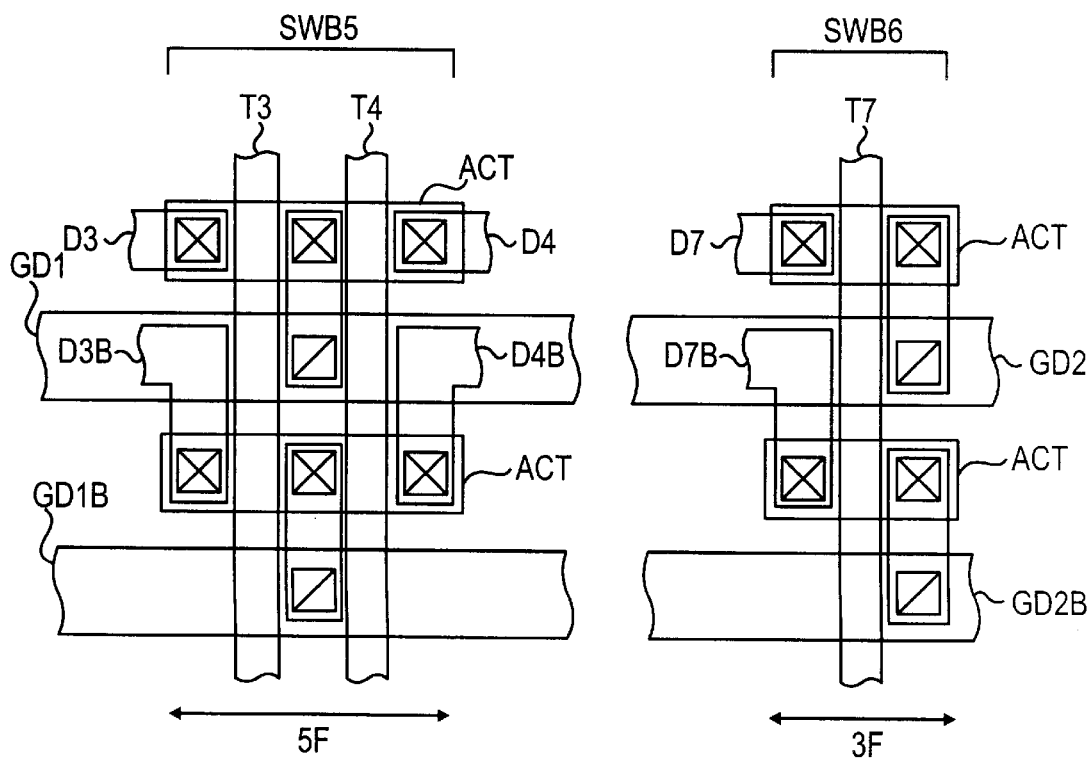
FIG. 18B  FIG. 18C

SEMICONDUCTOR MEMORY HAVING A HIERARCHICAL DATA LINE STRUCTURE

FIELD OF THE INVENTION

The present invention relates to a semiconductor memory and more particularly to a technology for reducing power consumption, increasing operation speed and reducing an area of a dynamic random access memory (DRAM).

BACKGROUND OF THE INVENTION

In recent years, DRAMs have made a significant advance in terms of circuit integration and a 1 Gb DRAM development chip has already been made public. The biggest challenge faced in realizing such large capacity DRAMs is an increase in power consumption. The power consumption of DRAMs includes the power consumption by memory arrays and peripheral circuits. Normally, the former accounts for the major portion of the DRAM's power consumption. The power consumed by the memory arrays is due to the parasitic capacitors Cd of data lines that are charged or discharged. As the capacity of memory arrays increases, the number of data lines charged and discharged simultaneously increases, thus increasing the power consumption of the memory arrays.

Finding a method of hierarchically structuring the data lines and dividing them into multiple parts to reduce the Cd charge/discharge power or to increase the number of readout signals from memory cells is drawing increased attention. A method of keeping the chip area from increasing when the number of divisions of data lines is increased is detailed as a BMGB (bidirectional matched global bit line) method in an IEEE publication entitled "1993 Symposium on VLSI Circuits Digest of Technical Papers", pp. 91–92 (1993).

FIG. 16 shows a memory array of the BMGB method described in FIG. 1(b) of the above-mentioned publication. Memory cells (MC's) are connected to the intersections between the word lines (W) and the data lines (D) and have a cell arrangement that is of a folded data line structure. At each data line D, there is provided a data line connection switch (QT). A global data line pair (GD-GDB) is provided parallel to data lines D. Three global data line pairs (GD0-GD0B to GD2-GD2B) are aligned in the direction of data lines and are connected with each other by global data line separation switches (QM0, QM0B, QM1 and QM1B). The global data line pairs are connected to the sense amplifiers (SA0, SA1) at both ends as shown.

The connection relation between the data lines D and the global data lines GD is as follows. The pairs D0-D0B and D1-D1B are connected at their right ends to QT0 and QT1, which in turn are connected to GD0-GD0B and GD1-GD1B, respectively. D2-D2B and D3-D3B are connected at their left ends to QT2 and QT3, which in turn are connected to GD1-GD1B and GD0-GD0B, respectively. That is, in this example, data line connection switches (QTs) and global data line separation switches (QMs) are concentrated in the switch block SWB. Other data lines are similarly connected to global data lines.

FIG. 16 shows the switch control when reading data from memory cells (MC) at the intersections between W0 and D0 and D1. Only QT0 and QT1 are turned on, with other data line connection switches (QT) turned off. QM0-QM0B are turned off, with QM1-QM1B turned on. This connects D0-D0B to SA0 through GD0-GD0B, and D1-D1B to SA1 through GD1-GD1B and GD2-GD2B.

This method reduces the length of data lines connected to the sense amplifiers to ¼ compared to that of the normal array configuration and also reduces the parasitic capacitance Cd to ¼. On the other hand, this configuration connects extra parasitic capacitance of global data lines. Data lines have a large number of memory cell transistors connected thereto and thus have a large parasitic capacitance whereas global data lines have a simple wiring configuration using a wiring layer located above that of data lines and have a relatively small parasitic capacitance. Hence, the total parasitic capacitance connected to the sense amplifiers is smaller than the parasitic capacitance of the conventional method. This allows reduction in the charge/discharge power consumption of the array and an improved signal to noise (S/N) ratio.

FIG. 23 shows conventional twisted global data lines according to FIG. 2 of the above-mentioned IEEE publication, in which the global data lines are twisted to reduce coupling noise between global data lines. In the figure, the present inventors assumed that the length of global data lines corresponds to 1024 word lines and the length of data lines to 128 word lines. The sense amplifier blocks (SB) include CMOS sense amplifiers. Data lines and data line connection switches are not shown.

As shown in the figure, global data lines connected to SB0 and SB1 are twisted in an area between QM0 and QM2, and global data lines connected to SB2 and SB3 are twisted in an area between QM6 and QM8, shifted one column from the first area. Other global data lines are arranged by repeating the configuration of FIG. 23 as a unit in the direction of word lines.

The following is a discussion of the problems in the prior art as discovered by the present inventors:

(1) The first problem is related to the area needed for the switch. FIG. 17 shows a plan view (example layout) of a concrete integrated circuit that realizes the switch block SWB of the BMGB system of FIG. 16. It is assumed that switches QT and QM can each be realized by a single MOS transistor. In the figure, ACT represents an active region where MOS transistors are formed; FG a gate electrode; CONT a connection region (through-hole region) where a conductive layer forming data lines and ACT are connected; and TC1 a connection region where a conductive layer forming data lines and a conductive layer forming global data lines are connected. In the layout of FIG. 17, an ideal layout rule is assumed in which the minimum fabrication dimension is represented by F and the lithography deviation between layers is zero. This layout rule allows the switch portion of the array of FIG. 16 to be formed in an area 8 F long in the word line direction and 13 F long in the data line direction, the total length of the switch portion being 26 F. This layout, however, has a problem that there are many intersections of wires, making the layout difficult to form and increasing the area. Further, it is necessary in forming wiring to use narrow diffusion layers at intersections, thus increasing resistance of the switch portion.

(2) The second problem is one of signal delay and power consumption when global data lines become long. In the array of FIG. 16, when the chip increases in capacity and the array size becomes large, the global data line becomes long, giving rise to a problem of signal delay and increased power consumption at the global data line.

(3) The third problem has to with the signal to noise (S/N) ratio when the global data line becomes long. The imbalance in the length of the global data lines (GD)

connected to SA0 and SA1 deteriorates the S/N. For example, in FIG. 16, when a word line W0 is selected, the data line pair D0-D0B is connected to SA0 through a GD0-GD0B pair while the data line pair D1-D1B are connected to SA1 through GD1-GD1B and GD2-GD2B pairs. This system has a unique S/N problem as described below.

Suppose that the parasitic capacitance for each data line D is Cd, that the parasitic capacitance for a part of a global data line GD equal in length to D is Cgd and that the memory cell capacitance is Cs. The parasitic capacitance connected to an input GD0 to SA0 is Csa0(t)=Cs+Cd+Cgd, because the memory cell is connected. The parasitic capacitance connected to an input GD0B is Csa0(b)=Cd+Cgd, because the memory cell is not connected. Similarly, the parasitic capacitance connected to an input GD1 to SA1 is Csa1(t)=Cs+Cd+3Cgd and the parasitic capacitance connected to an input GD1B is Csa1(b)=Cd +3Cgd. Here, noise Vn(0) and Vn(1) induced by imbalance in memory capacitance between the input pairs for SA0 and SA1 are given as follows (as presented in "Ultra-LSI Memory" by Kyoo Itoh, Published by Baifukan, 1994, page 205):

$$Vn(0)=A \cdot Cs \cdot [K0/(Cd+Cgd)]^{(\frac{1}{2})} \quad (1)$$

$$Vn(1)=A \cdot Cs \cdot [K1/(Cd+3Cgd)]^{(\frac{1}{2})} \quad (2)$$

In these equations (1) and (2), A is a proportional constant, and K0 and K1 are amplification velocities for SA0 and SA1, respectively. When the parasitic capacitance for the global data line Cgd cannot be ignored, there is a possibility of Vn(0) increasing very greatly compared with Vn(1). This is because Cd+Cgd<Cd+3Cgd and when SA0 and SA1 are driven with the same driving force, SA0 with a smaller parasitic capacitance is amplified faster, resulting in K0>K1.

There is also a possibility that other noise or coupling noise from D0-D0B to D1-D1B may increase. This is because, if there is a difference in the amplification speed between SA0 and SA1, the D0-D0B pair is amplified rapidly to a large amplitude and the D1-D1B pair slowly so that the capacitance coupling noise to the D1-D1B pair whose signal is still small cannot be ignored.

(4) A fourth problem has to do with coupling noise between global data lines. With the global data line twisting method shown in FIG. 23, an imbalance occurs in the coupling capacitance in the worst case and noise cannot be canceled out completely.

Consider a case where, in FIG. 23, QM0 and QM5 are turned off and other global data line separation switches are turned on, which represents a worst case for sense amplifiers (SA) in SA1 and SB1 in which the read signal form the memory cell is the smallest. Suppose that under the condition that all global data lines are precharged to 1 V and floating, SA in SB1 is activated to amplify the sense amplifier node I1 to 2V and I1B to 0V. At this time, consider the coupling noise that global data lines connected to I3 and I3B receive. As to I3, GD9 receives a negative coupling from GD4B and GD6 receives a positive coupling from GD1. However, because the length of GD9 corresponds to that of 128 word lines and the length of GD6 to that of 256 word lines, the positive coupling is two times larger than the negative and thus the positive noise for 128 word lines remains intact. Next, as for I3B, GD8B receives a negative coupling from GD3B and GD7B receives a positive coupling from GD2. In this case, both GD8B and GD7B have the same length of 256 word lines and therefore the positive and negative couplings are canceled out. Because the noise differs between I3 and I3B, the operation margin for SA in SB3 deteriorates.

Conversely, let us consider the coupling noise that the global data lines connected to I1 and I1B receive when SA in SB3 is activated to amplify the sense amplifier node I3 to 2V and I3B to 0V. As to I1, GD2 receives a negative coupling from GD7B and GD1 receives a positive coupling from GD6. In this case, both GD2 and GD1 are 256 W long and their positive and negative couplings are canceled out. Next for I1B, GD4B receives a positive coupling from GD9 and GD3B receives a negative coupling from GD8B. Because GD4B is 128 W long and GD3B is 256 W long, the negative coupling is two times larger and thus the negative noise for the length of 128 W remains intact. Therefore, in this case, too, the noise differs between I1 and I1B, degrading the margin of operation of SA in SB1.

In a DRAM of a hierarchical data line structure, the object of the present invention is to (1) provide a circuit system which reduces the size of switches when forming data lines in hierarchical structures so that the chip area can be kept from increasing when the number of divisions of data lines is increased; (2) suppress increases in signal delay and power consumption in the global data lines; (3) offer an operation system that prevents deterioration of the S/N even when there is an imbalance in parasitic capacitance between global data lines; and (4) reduce the coupling noise between the global data lines.

SUMMARY OF THE INVENTION

To achieve the above mentioned object and other not specifically mentioned, the semiconductor memory of the present invention has the following features:

(1) The semiconductor memory of this invention includes: a unit memory array having: word lines wired so that their longitudinal direction is parallel to a first direction; data lines wired so that their longitudinal direction is parallel to a second direction perpendicular to the first direction; memory cells arranged at intersections between the word lines and the data lines; data line connection switches; global data lines wired so that their longitudinal direction is parallel to the second direction; global data line separation switches; and sense amplifiers;

wherein a plurality of global data lines are arranged in the second direction, two pairs of global data lines arranged at the ends are connected with different sense amplifiers, global data lines arranged in close proximity of each other in the second direction are connected to each other by two serially connected global data line separation switches, and of two pairs of data lines arranged in the first direction, a first pair of data lines are connected through a data line connection switch to a connecting point between the global data line and the global data line separation switch and a second pair of data lines are connected through a data line connection switch to a connecting point between two global data line separation switches.

(2) The semiconductor memory of this invention includes a unit memory array as defined in (1), wherein a plurality of global data lines are arranged in the second direction, two pairs of global data lines arranged at the ends are connected with different sense amplifiers, global data lines arranged in close proximity of each other in the second direction are connected to each other by one global data line separation switch, two pairs of data lines arranged in the first direction are connected through data line connection switches to different global data line pairs, and data line connection switches for two pairs of data lines arranged in the first direction are located on the opposing sides of the data lines.

(3) The semiconductor memory of this invention includes a unit memory array as defined in (1), wherein a plurality of global data lines are arranged in the second direction, two pairs of global data lines arranged at the ends are connected with different sense amplifiers, global data lines arranged in close proximity of each other in the second direction are connected to each other by one global data line separation switch, two pairs of data lines arranged in the first direction are connected through data line connection switches to different global data line pairs, and data line connection switches for two pairs of data lines arranged in the first direction are located on the same sides of the data lines and shifted from each other in the second direction.

(4) In the semiconductor memory described in (1) to (3), when reading data from two pairs of data lines arranged in the first direction or writing data into these data lines, a first data line connection switch between the first data line pair and the first global data line pair is turned on to connect the first data lines to a first sense amplifier, a second data line connection switch between the second data line pair and the second global data line pair is turned on to connect the second data lines to a second sense amplifier, and one or two global data line separation switches connected between the first global data line pair and the second global data line pair are turned off.

(5) The semiconductor memory described in (1) to (3) further includes: column switches; column selection lines wired so that their longitudinal direction is set parallel to the second direction and used to control the column switches; a substrate; a first wiring layer; and a second wiring layer; wherein the column switches are formed on the substrate, the data lines are formed in the first wiring layer, the global data lines and the column selection lines are formed in the second wiring layer, the first wiring layer is interposed between the substrate and the second wiring layer, the global data lines are wired at a pitch of one global data line for every two data lines, and the column selection lines are wired at a pitch of one column selection line for every four or more data lines.

(6) The semiconductor memory described in (1) to (3) further includes: column switches; column selection lines wired so that their longitudinal direction is set parallel to the second direction and used to control the column switches; a substrate; a first wiring layer; a second wiring layer; and a third wiring layer; wherein the column switches are formed on the substrate, the data lines are formed in the first wiring layer, the global data lines are formed in the second wiring layer, the column selection lines are formed in the third wiring layer, the distance from the substrate to the wiring layers increases in the order of the first wiring layer, the second wiring layer and the third wiring layer, the global data lines are wired at a pitch of one global data line for every two data lines, and the column selection lines are wired at a pitch of one column selection line for every four or more data lines.

(7) The semiconductor memory of the present invention includes: word lines wired so that their longitudinal direction is parallel to a first direction; data lines wired so that their longitudinal direction is parallel to a second direction perpendicular to the first direction; memory cells arranged at intersections between the word lines and the data lines; data line connection switches; global data lines wired so that their longitudinal direction is parallel to the second direction; global data line separation switches; sense amplifiers; sense amplifier NMOS drive lines; sense amplifier PMOS drive lines; and a sense amplifier drive circuit; wherein a plurality of global data lines are arranged in the second direction, two pairs of global data lines arranged at the ends are connected with different sense amplifiers, global data lines arranged in close proximity of each other in the second direction are connected to each other by one or two global data line separation switches, the sense amplifier drive circuits comprise a first NMOS transistor, a second NMOS transistor, a first PMOS transistor and a second PMOS transistor, the first and second NMOS transistors have their sources connected to a first power supply and their drains connected to the sense amplifier NMOS drive line, the first and second PMOS transistors have their sources connected to a second power supply and their drains connected to the sense amplifier PMOS drive line, a current drive power of the first NMOS transistor is greater than that of the second NMOS transistor, and a current drive power of the first PMOS transistor is greater than that of the second PMOS transistor.

(8) In the semiconductor memory described in (7), when loads of the sense amplifiers are large, the first NMOS transistor and the first PMOS transistor are turned on to connect the sense amplifier NMOS drive line to the first power supply and the sense amplifier PMOS drive line to the second power supply, and when loads of the sense amplifiers are small, the second NMOS transistor and the second PMOS transistor are turned on to connect the sense amplifier NMOS drive line to the first power supply and the sense amplifier PMOS drive line to the second power supply, in order to vary the current drive power of the sense amplifier drive circuit.

(9) The semiconductor memory of this invention includes a unit memory array as defined in (1), wherein a plurality of global data lines are arranged in the second direction, two pairs of global data lines arranged at the ends are connected with different sense amplifiers, global data lines arranged in close proximity of each other in the second direction are connected to each other by one or two global data line separation switches, and when the sense amplifiers are activated after activating the word lines with the data line connection switches turned on, the resistance of the data line connection switches is increased.

(10) In the semiconductor memory described in (1) to (9), the memory cell comprises one MOSFET as a switch and an information storing capacitor.

(11) the semiconductor memory of this invention comprises: word lines wired so that their longitudinal direction is parallel to a first direction; data lines wired so that their longitudinal direction is parallel to a second direction perpendicular to the first direction; memory cells arranged at intersections between the word lines and the data lines; data line connection switches; global data lines wired so that their longitudinal direction is parallel to the second direction; global data line sense amplifiers; and data line sense amplifiers; and global data line separation switches; wherein a plurality of global data lines are arranged in the second direction, two pairs of global data lines arranged at the ends are connected with different global data line sense amplifiers, adjoining global data lines are connected to each other by the global data line separation switch, the data lines are connected to the data line sense amplifiers, the memory cell comprises one MOSFET as a switch and an information storing capacitor, the data line sense amplifier includes a MOSFET of the same conduction type as that of the memory cell MOSFET, and the global data line sense amplifier includes a MOSFET of a conduction type different from that of the memory cell MOSFET.

(12) In the semiconductor memory described in (11), the data line sense amplifier has a current-to-voltage conversion function.

(13) The semiconductor memory of this invention includes a unit memory array having: word lines wired so that their longitudinal direction is parallel to a first direction; data lines wired so that their longitudinal direction is parallel to a second direction perpendicular to the first direction; memory cells arranged at intersections between the word lines and the data lines; data line connection switches; global data lines wired so that their longitudinal direction is parallel to the second direction; global data line separation switches; and sense amplifiers; wherein two global data lines are parallelly arranged in close proximity of each other in the first direction to form a global data line pair; wherein two sets of a global data line separation switch or two sets of two global data line separation switches connected in series are arranged in the first direction to form a global data line separation switch pair; wherein a first global data line pair, a first global data line separation switch pair, a second global data line pair and a second global data line separation switch pair are arranged in the second direction in that order in close proximity of each other in order to form a first global data line group; wherein third and fourth global data line pairs are arranged in close proximity of the first and second global data line pairs in the first direction and third and fourth global data line separation switch pairs are arranged in close proximity of the first and second global data line separation switch pairs in the first direction in order to form a second global data line group; wherein the first and second global data line groups are combined to form a unit global data line group; wherein the unit global data line group is repetitively arranged in the first and second directions and additional global data line pairs are arranged in close proximity of those global data line separation switch pairs in the second direction which are located at the ends of these unit global data line groups with respect to the second direction, to form a memory array;

wherein when connecting the global data line pairs arranged in their close proximity on both sides in the second direction, the first and fourth global data line separation switch pairs connect ends of those global data lines whose first direction positions are the same; wherein when connecting the global data line pairs arranged in their close proximity on both sides in the second direction, the second and third global data line separation switch pairs connect ends of those global data lines whose first direction positions are different; wherein if the global data line group arranged repetitively in the second direction is taken as a global data line column, the sense amplifiers are connected to at least two global data line pairs of each global data line column almost at the center of the global data lines.

(14) The semiconductor memory of this invention includes a unit memory array as defined in (13), wherein the first to fourth global data line separation switch pairs, when connecting the global data line pairs arranged in close proximity on both sides thereof in the second direction, connect ends of those global data lines whose first direction positions are the same; wherein the second and third global data line pairs exchange their second direction positions at virtually the center of the global data lines and the first and fourth global data line pairs do not exchange their second direction positions; wherein if the global data line group arranged repetitively in the second direction is taken as a global data line column, the sense amplifiers are connected to at least two global data line pairs of each global data line column almost at the center of the global data lines.

(15) In the semiconductor memory described in (13) or (14), of two data line pairs arranged in the first direction, a first data line pair is connected through a data line connection switch to a connecting point between the global data line and the global data line separation switch, and a second data line pair is connected through a data line connection switch to a connecting point between two global data line separation switches.

(16) In the semiconductor memory described in (13) or (14), two data line pairs arranged in the first direction are connected through data line connection switches to different global data line pairs, and data line connection switches for the two data line pairs arranged in the first direction are located on the opposing sides of the data lines.

(17) In the semiconductor memory described in (13) or (14), two data line pairs arranged in the first direction are connected through data line connection switches to different global data line pairs, and data line connection switches for the two data line pairs arranged in the first direction are located on the same sides of the data lines and shifted from each other in the second direction.

BRIEF DESCRIPTION OF THE DRAWINGS

FIGS. 18(a)–18(c) is a layout of switches in the memory array (4) of this invention;

DETAILED DESCRIPTION OF THE PREFERRED EMBODIMENTS

Embodiments of the present invention will be described by referring to the accompanying drawings. Circuit devices making up each block in the embodiments may be formed on a single semiconductor substrate such as a single crystal silicon by known integrated circuit technologies such as CMOS (complementary MOS transistor) technology. Circuit symbols of MOS transistors without an arrow represent N-type MOS (NMOS) transistors as distinguished from those with an arrow that represent P-type MOS (PMOS) transistors.

(Embodiment 1)

Figure 1:
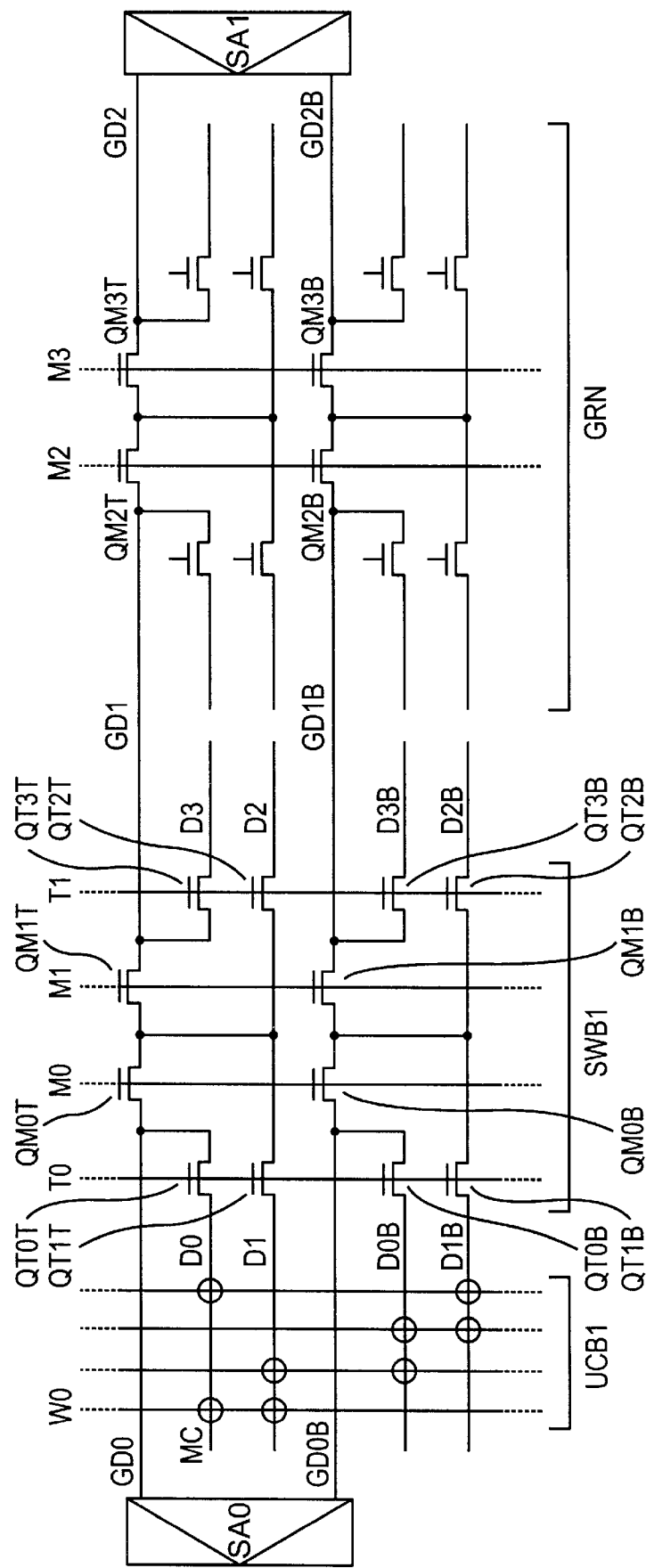
FIG. 1 is a circuit diagram of a memory array (1) of the present invention.

FIG. 1 shows a DRAM memory array (1) of a switch-separated type hierarchical data line structure according to this invention. Memory cells (MC) are connected to the intersections between the word lines (W) and the data lines (D). This memory array uses a cell arrangement (1), which is a variation of the folded data line structure, in which the MC is placed at an intersection between W0 and D0 but not at an intersection between W0 and D0B and alternate data lines D0-D0B and D1-D1B form pairs. As for the cell arrangement, a cell block UCB1 shown as a unit is repetitively arranged in the data line direction. Each data line (D) is provided with a data line connection switch (QT). A data line associated with D0 can be seen as a single long data line divided into four sections (D0, D3, . . . ).

A pair of global data lines (GD-GDB) are arranged in parallel with data line D. Three global data lines are arranged in the data line direction (GD0 to GD2) and are connected by two serially connected global data line separation switches (QM). A global data line associated with GD0 can be seen as a single long global data line divided into three sections (GD0, GD1, GD2), with their dividing points connected by series-connected first and second switches (a pair of QM0T and QM1T and a pair of QM2T and QM3T). Global data line pairs at the ends are connected to sense amplifiers (SA0, SA1).

To further clarify the hierarchical structure, the data lines and the global data lines may be called sub data lines and main data lines, respectively. The main and sub data lines are provided in the complementary form so that they can be amplified differentially. As an example, a non-inverted sub data line D0 and an inverted sub data line D0B together form a pair of sub data lines (more simply referred to as a sub data line), and a non-inverted main data line GD0 and an inverted complementary data line GD0B together form a pair of main data lines (more simply referred to as a main data line).

D0 and D0B are connected at their right ends with QT0T and QT0B. QT0T is connected to a connecting point between GD0 and QM0T, and QT0B to a connecting point between GD0B and QM0B. Right-hand ends of D1 and D1B are connected with QT1T and QT1B. QT1T is connected to a connecting point between QM0T and QM1T, and QT1B to a connecting point between QM0B and QM1B. D2 and D2B have their left ends connected with QT2T and QT2B. QT2T is connected to a connecting point between QM0T and QM1T, and QT2B to a connecting point between QM0B and QM1B. D3 and D3B are connected at their left ends with QT3T and QT3B. QT3T is connected to a connecting point between GD1 and QM1T, and QT3B to a connecting point between GD1B and QM1B. In FIG. 1, when data is to be read from memory cells at intersections between W0 and D0/D1, T0 is activated to turn on QT0T-QT0B and QT1T-QT1B and turn off other data line connection switches. QM0T-QM0B are turned off and other global data line separation switches are turned on. This connects D0-D0B through GD0-GD0B to SA0, and D1-D1B through GD1-GD1B and GD2-GD2B to SA1.

A feature of the array according to this invention is that two global data line separation switches are connected in series and are used independently of each other for data lines on both sides, i.e., the left-hand side switch is used for separating the left-hand side data lines and the right-hand side switch is used for separating the right-hand side data lines.

Figure 2A:
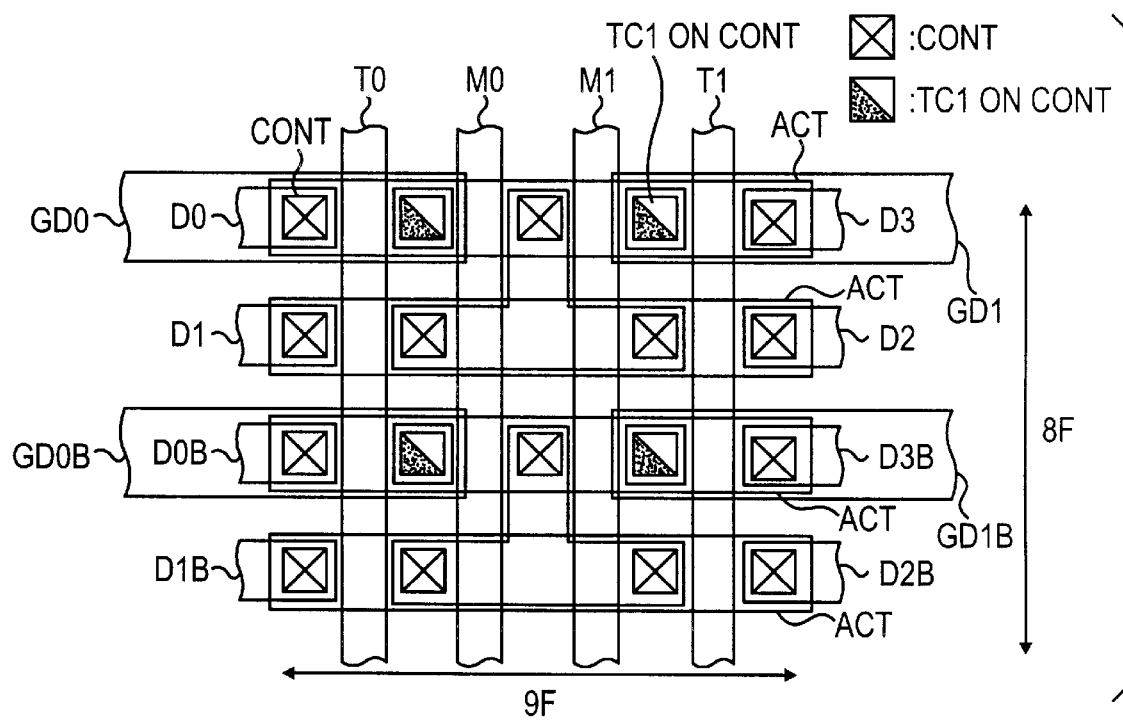
FIGS. 2(a)–2(b) is a layout of a switch in the memory array (1)
Figure 17:
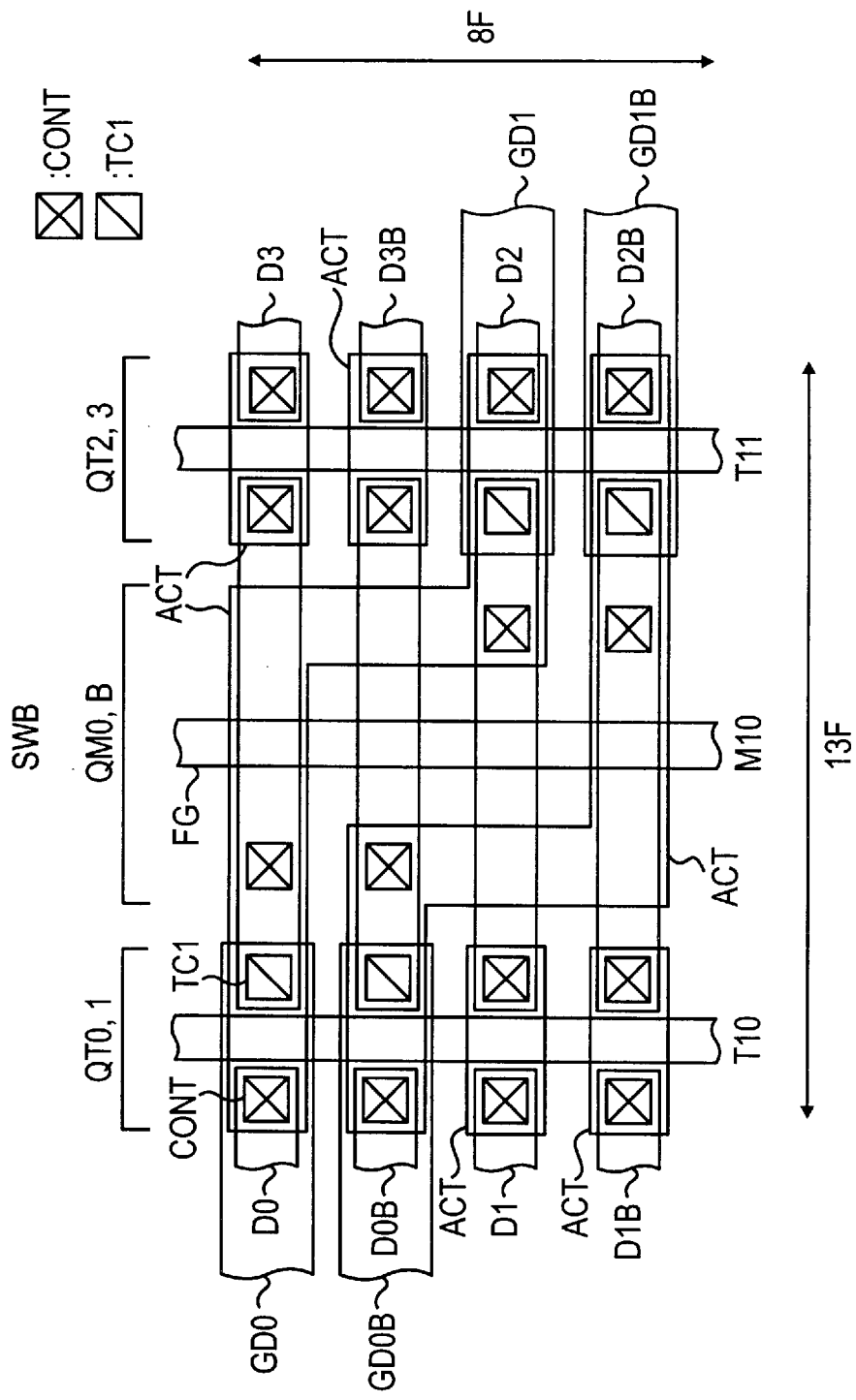
FIG. 17 is a layout of a switch in the conventional memory array.

One advantage realized by this invention is that because the number of intersections of lines can be reduced when connecting the data line connection switches, the global data lines and the global data line separation switches, the circuit layout becomes simple, and there is a reduction in the area of the array as compared with FIG. 17. FIG. 2(a) shows a layout of a switch block SWB1 in the array (1). Here, ACT represents an active region where MOS transistors are formed; CONT a connection region where a conductive layer (first wiring layer) forming data lines is connected with the ACT; and TC1 a connection region that connects the conductive layer forming data lines with a conductive layer forming (second wiring layer located above the first wiring layer) global data lines. This layout assumes an ideal layout rule with a minimum fabrication dimension of F lithography deviation between layers set to zero. This layout can be formed in an area measuring 8 F in the word line direction and 9 F in the data line direction. Hence, the total overhead of the switches between the sense amplifiers is 18 F(=9 F+9 F), which is smaller than the overhead value of 26 F(=13 F+13 F) in FIG. 17.

This layout has the following overall chip area reduction effect. As the memory capacity becomes large, the number of data line divisions, i.e., the number of switches, increases. In a 1 Gb DRAM, 32K word lines are present. Assuming that the number of cells connected to one pair of data lines is 128 and that four data lines are arranged in the data line direction between the sense amplifiers, the chip as a whole requires 32K/(128×4)=64 switches in the data line direction. Hence, compared with the conventional layout, this arrangement can reduce the chip length by L=(12 F–18 F)×64=512 F in the data line direction, which translates to L=76.8 μm if we assume F=0.15 μm.

In the layout of FIG. 1, four data lines are arranged in the data line direction between SA0 and SA1. When two data lines are used, GD1 can be connected directly to SA1 by eliminating global data line separation switches, and GD0 and GD1 need only to be simply separated. Hence, in this case, the chip area can be reduced by as much as the area occupied by the global data line separation switches. It is also possible to increase the number of data lines arranged between SA0 and SA1 by increasing the number of units identified by the symbol GRN in FIG. 1. GRN includes two unit cell blocks with a switch block positioned between them.

(Embodiment 2)

Figure 3:
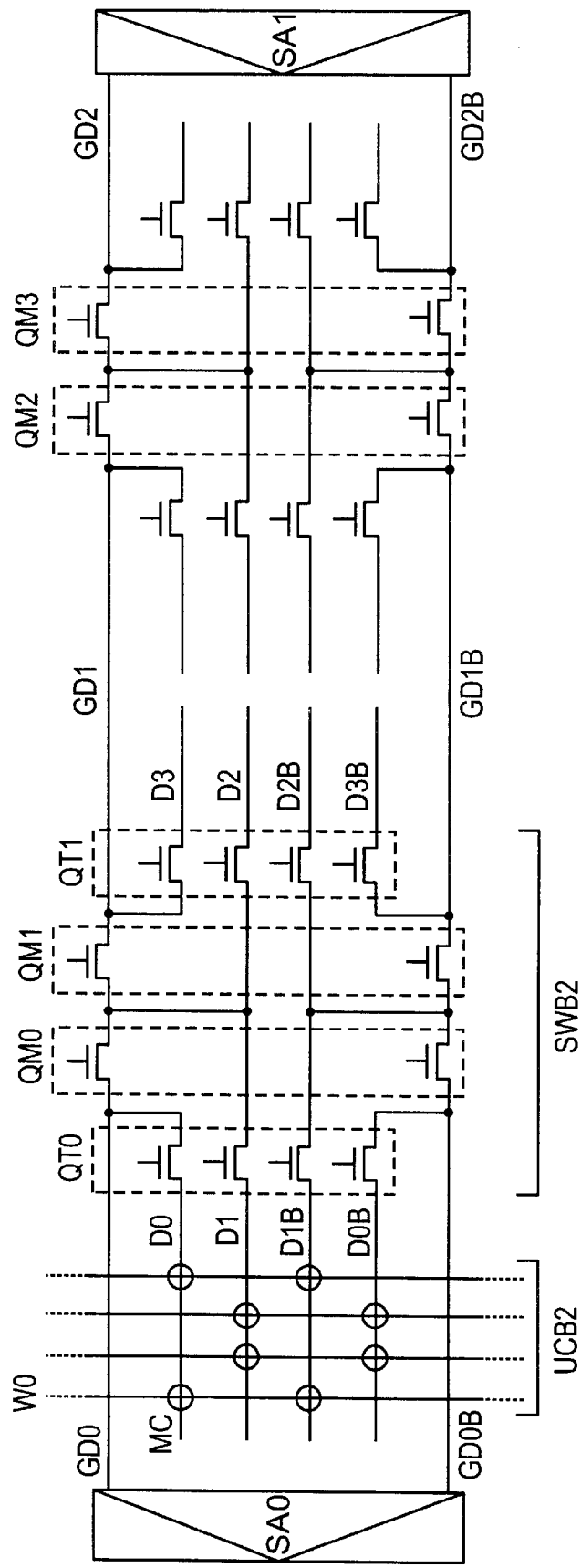
FIG. 3 is a circuit diagram of a memory array (2) of this invention.

The memory array (2) shown in FIG. 3 employs the switch-separated type hierarchical data line structure shown above and has memory cells arranged in a folded data line structure cell arrangement (2). The cell block UCB2 shown as a unit is repetitively arranged in the data line direction. The connection between the sense amplifiers and the data lines is different from that used in the ordinary folded data line structure. That is, of the four word lines arranged in the word line direction, two outer data lines form a pair D0-D0B and two inner data lines form another pair D1-D1B.

Connecting the sense amplifiers and the data lines in this way eliminates intersections of lines at switch locations even when the folded data line structure cell arrangement is used and thus offers an advantage of a reduced memory array area.

(Embodiment 3)

Figure 4:
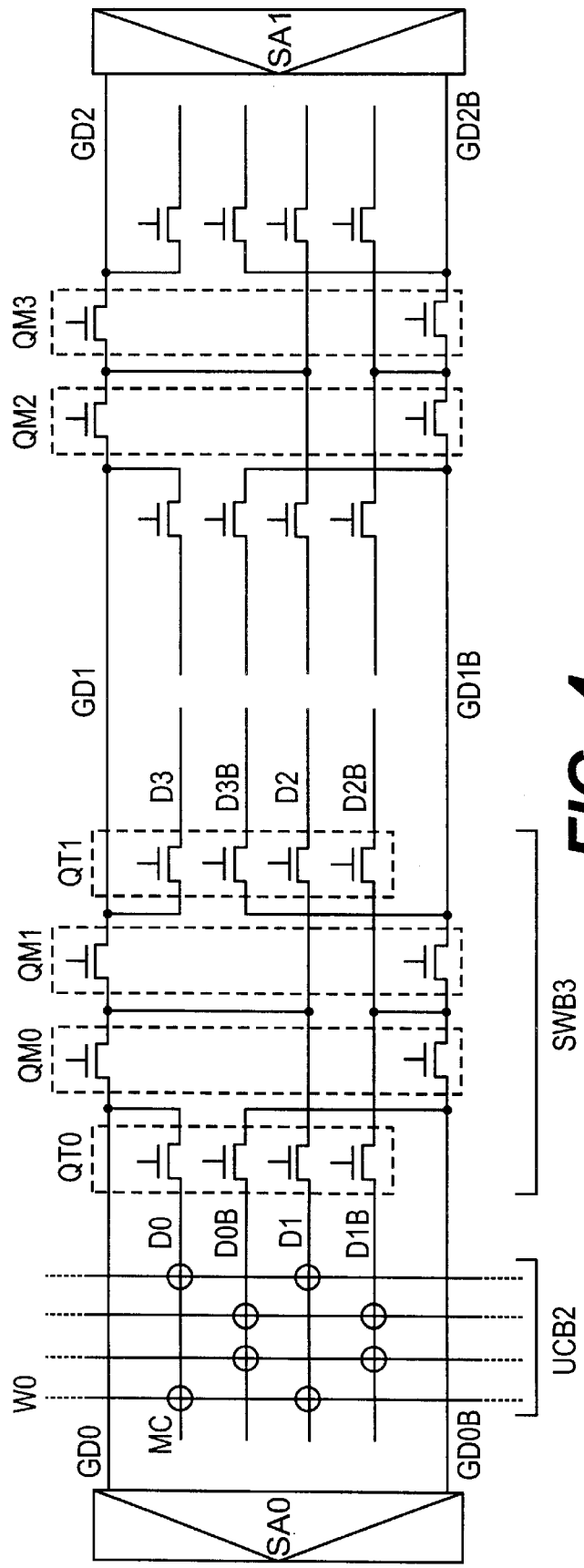
FIG. 4 is a circuit diagram of a memory array (3) of this invention.

The memory array (3) shown in FIG. 4 employs a switch-separated type hierarchical data line structure shown above and has memory cells arranged in a folded data line structure cell arrangement (2). The cell block UCB2 shown as a unit is repetitively arranged in the data line direction. The connection between the sense amplifiers and the data lines is the same as that of the ordinary folded data line structure, and two lines adjoining in the word line direction form a pair.

Connecting the sense amplifiers and the data lines in this manner has the advantage of minimizing the coupling noise between the data lines.

(Embodiment 4)

Figure 5:
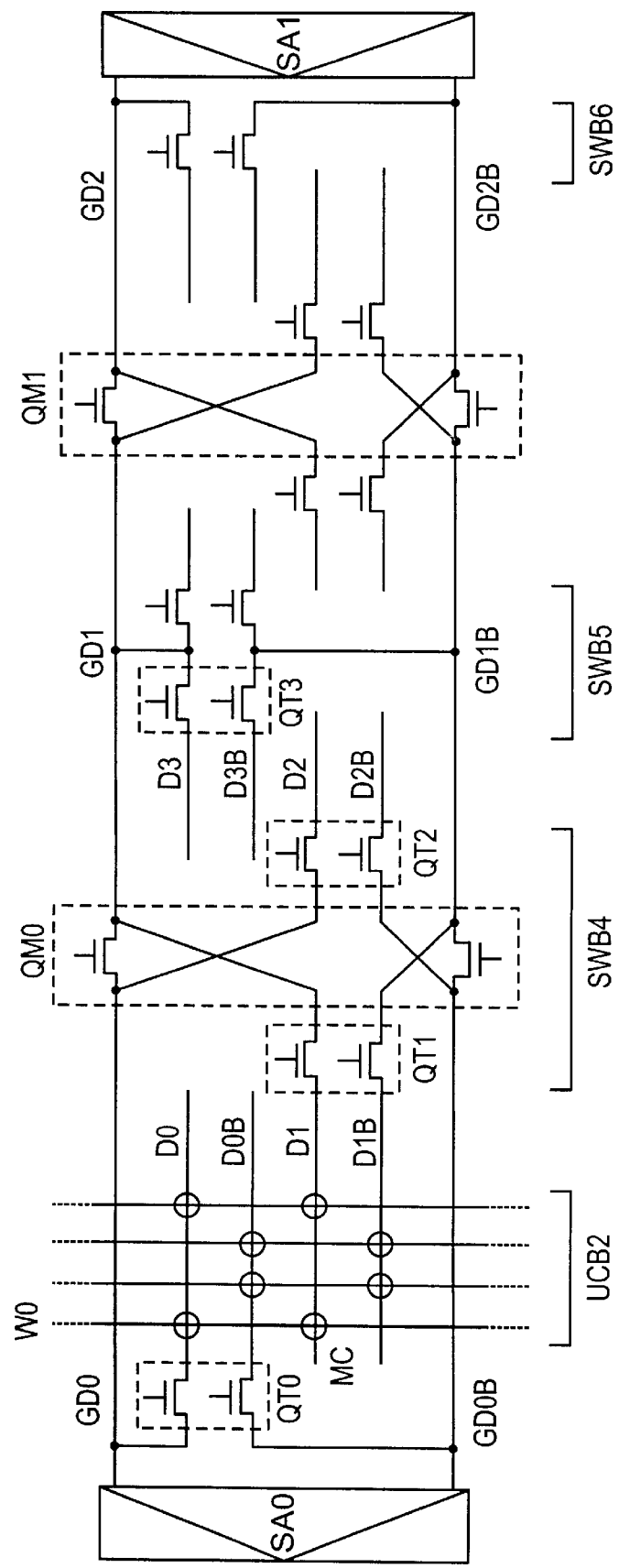
FIG. 5 is a circuit diagram of a memory array (4) of this invention.

FIG. 5 shows a DRAM memory array (4) of an alternating-positioning-switch type hierarchical data line structure according to this invention. Memory cells (MC) are connected to intersections between the word lines (W) and the data lines (D). This layout uses a folded data line structure cell arrangement (UCB2), and the connection between the sense amplifiers and the data lines is the one used in the ordinary folded data line structure in which two data lines adjoining in the word line direction form a pair. Each data line D is provided with a data line connection switch (QT). A global data line pair (GD-GDB) is arranged in parallel with the data lines. Three global data lines (GD0 to GD2) are arranged in line in the data line direction and are connected through single global data line separation switches (QM0, QM1). Global data line pairs at the ends are connected with sense amplifiers (SA0, SA1).

D0-D0B is connected at its left end with QT0, and D1-D1B is connected at its right end with QT1. QT0 and QT are connected to GD0-GD0B and GD1-GD1B, respectively. D2-D2B is connected at its left end with QT2 and D3-D3B is connected at its right end with QT3. QT2 and QT3 are connected to GD0-GD0B and GD1-GD1B, respectively.

A feature of the memory array of this embodiment is that the adjoining data line pairs have data line connection switches alternately positioned, i.e., arranged on opposite sides with respect to the data lines. Other data lines are similarly connected to global data lines.

The layouts of switch blocks SWB4 to SWB6 are shown in FIG. 18. The pitch in the word line direction of the data connection switches (QT0T-QT0B, etc.) is reduced to two times the pitch in the word line direction of the data lines, making the circuit layout easier.

(Embodiment 5)

Figure 6:
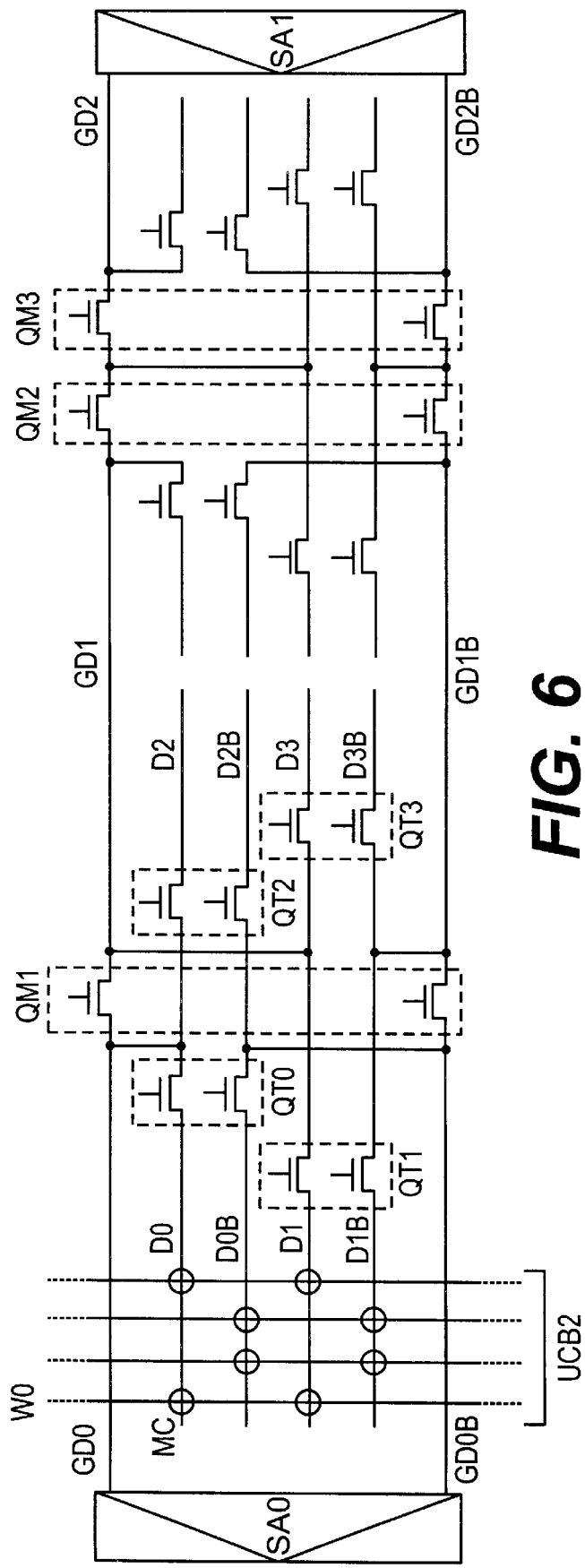
FIG. 6 is a circuit diagram of a memory array (5) of this invention.

FIG. 6 shows a DRAM memory array (5) of the alternating-positioning-switch type hierarchical data line structure. A feature of the array of this embodiment is that the data line connection switches (QT0, QT1, etc.) of adjoining data line pairs are arranged on the same side with respect to the data lines but are shifted with respect to each other in the data line direction. This embodiment also has the advantage of reducing the pitch in the word line direction of the data line connection switches to two times the pitch in the word line direction of the data lines, making the circuit layout easier. An example of the layout of the switch block having QT0, QT1, QM1, QT2, and QT3 are realized by combining the layouts in FIG. 18(A) and 18(C).

(Embodiment 6)

Figure 7:
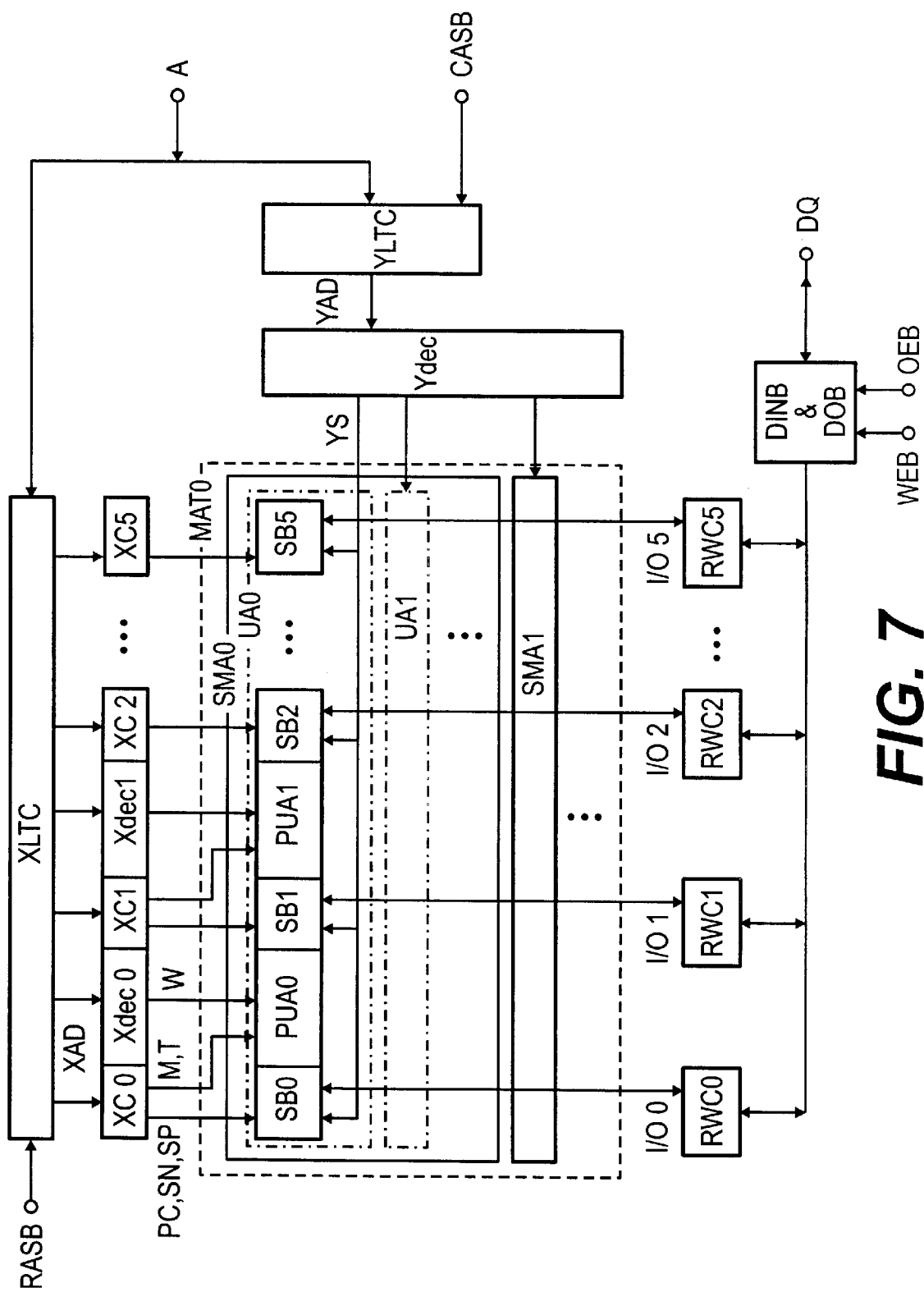
FIG. 7 is a schematic diagram showing the configuration of a chip.

FIG. 7 shows a chip configuration of the switch-separated type hierarchical data line structure or alternating-positioning-switch type hierarchical data line structure of this invention when a column decoder is shared by a plurality of column switches arranged in the data line direction (YS control system). This chip consists largely of a memory mat (MAT0) and peripheral circuits. Though not shown in the figure, two or more memory mats can be installed in the chip. The memory mat has a hierarchical structure ranging in order of size from sub memory arrays (SMA0, SMA1, . . . ) to unit memory arrays (UA0, UA1, . . . ). UA includes primitive unit memory arrays (PUA) containing data line connection switches and global data line separation switches and sense amplifier blocks (SB) containing a sense amplifier, a precharge circuit and a column switch, the primitive unit memory arrays and the sense amplifier blocks being arranged alternately. The word lines (W) are arranged vertically and the data lines horizontally.

The peripheral circuits are explained below. The address terminal (A) usually employs an address multiplex system in which a row address (X address) (XAD) and a column address (Y address) (YAD) are entered in a time division fashion. XAD is stored in a row address latch (XLTC) by a row address strobe signal (RASB). YAD is stored in a column address latch (YLTC) by a column address strobe signal CASB. If the address terminal has extra capacity, a full address system may be used in which XAD and YAD are entered simultaneously. XAD is entered into a row control circuit (XC) to produce control signals PC, M, T, which are described later. XAD is decoded by a-row decoder (X decoder) (Xdec) to select a corresponding word line W. After data has been read from memory cells connected to the word line W, the data is amplified by sense amplifier control signals SN, SP generated from XC. YAD is decoded by a column decoder (Y decoder) (Ydec) to select a column selection line (Y-selection line) (YS). Ydec is shared by column switches in a plurality of sense amplifier blocks and the column selection line YS is commonly entered into a plurality of sense amplifier blocks. In the reading operation, the column data selected by YS is read out through column switches onto a common input/output line pair (I/O), from which the read data is put out through a read/write circuit (RWC), an output buffer (D0B) and an input/output pin (DQ) to the outside of the chip. In the write operation, the memory cells of a column selected by YAD are written with data from outside the chip through the input buffer (DINB), RWC and I/O.

Figure 8A:
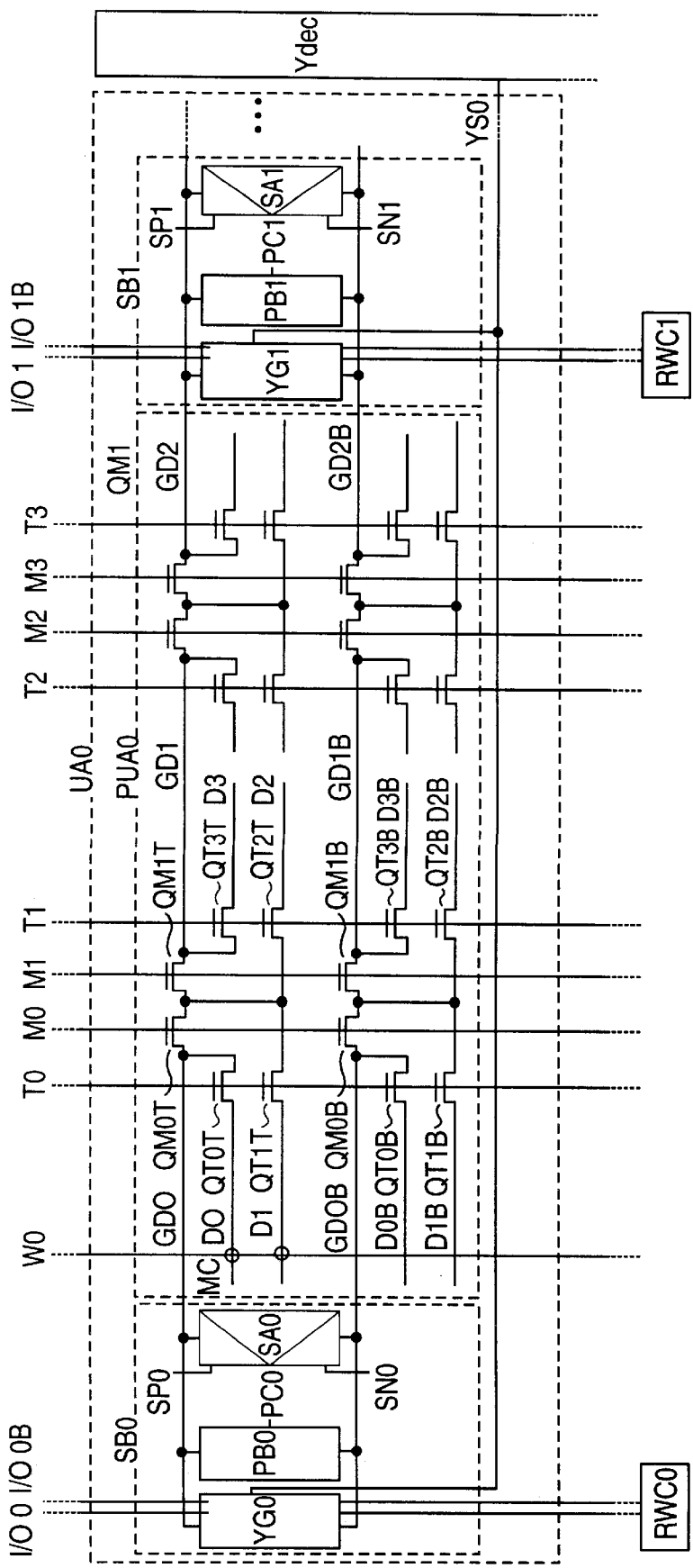
FIGS. 8(a)–8(b) is a circuit diagram of a memory array (6) of this invention.
Figure 8E:
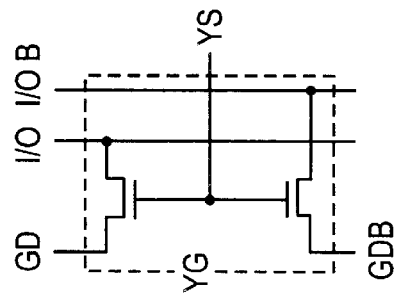
Figure 8D:
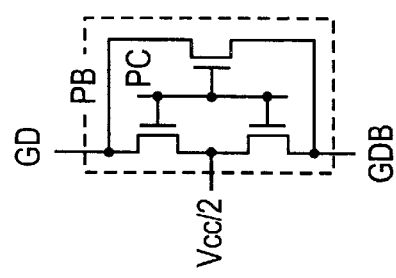
Figure 8C:
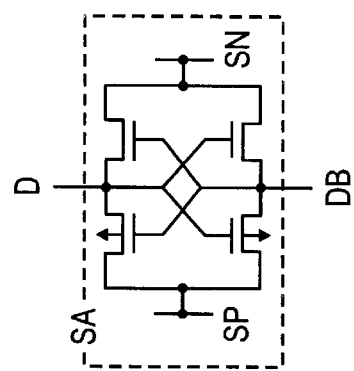
Figure 8B:
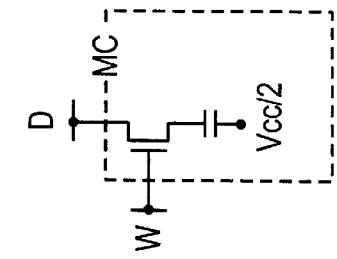

Detailed explanation of a UAO portion in FIG. 7 follows. FIG. 8(a) shows an array (6) that applies the YS control system to the array (1) of the switch-separated type hierarchical data line structure of this invention shown in FIG. 1 (Embodiment 1). The YS control system can also be applied similarly to the arrays of other embodiments. Data lines in two pairs in the word line direction and four pairs in the data line direction (D0-D0B, D1-D1B, etc.) are connected through data line connection switches to the global data lines (GD0-GD0B to GD2-GD2B) arranged in parallel to the data lines, in order to form a primitive unit memory array (PUA0). The global data line pairs GD0-GD0B and GD1-GD1B are connected to each other through QM0T-QM0B and QM1T-QM1B. GD1-GD1B and GD2-GD2B are connected to each other through QM2T-QM2B and QM3T-QM3B. Global data line pairs at both ends are connected to the sense amplifier blocks (SB).

As shown in FIG. 7, connected to the right of the SB1 is another primitive unit memory array PUA1. SB comprises a CMOS sense amplifier (SA), a precharge circuit (PB) and a column switch (YG). To the main input/output line pair (I/O-I/OB) are connected YG and a read/write circuit (RWC). Detailed circuits of MC, SA, PB and YG are shown in FIG. 8(b), 8(c), 8(d) and 8(e). The CMOS sense amplifier SA comprises a pair of PMOS transistors and a pair of NMOS transistors, in which their sources are commonly connected and their gates and drains are cross-connected. The output of Ydec is connected with the column selection line (YS), and column switches having the same YAD are controlled commonly by a single YS0.

In this embodiment a single unit memory array (UA) is divided into a plurality of primitive unit memory arrays and sense amplifier blocks. This arrangement offers the advantage of suppressing the signal delay and power consumption in the global data lines when the memory circuit integration enhances and UA becomes long. Further, because a plurality of column switches arranged in the data line direction are controlled commonly by YS, only one Ydec is needed even when the number of divisions of UA is increased. This prevents an increase in the chip area. The similar effect is produced even when the number of memory cells connected to one data line pair, the number of global data line pairs in the primitive unit memory array and the number of primitive unit arrays in one UA differ from those of this embodiment.

Figure 2B:
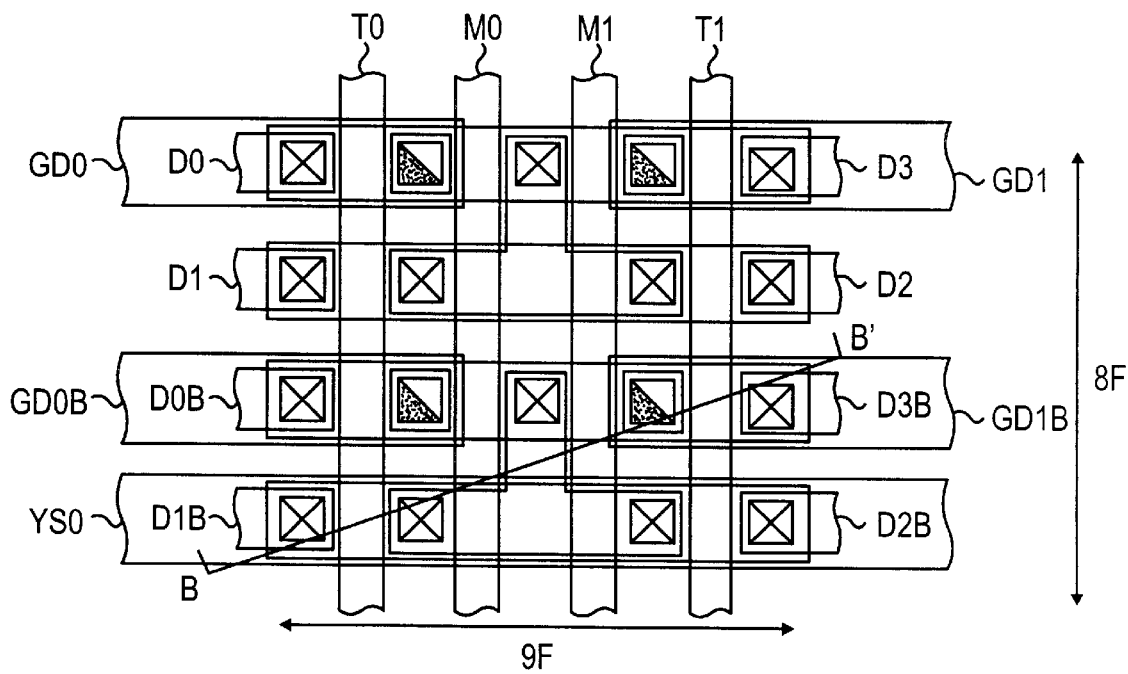
Figure 9:
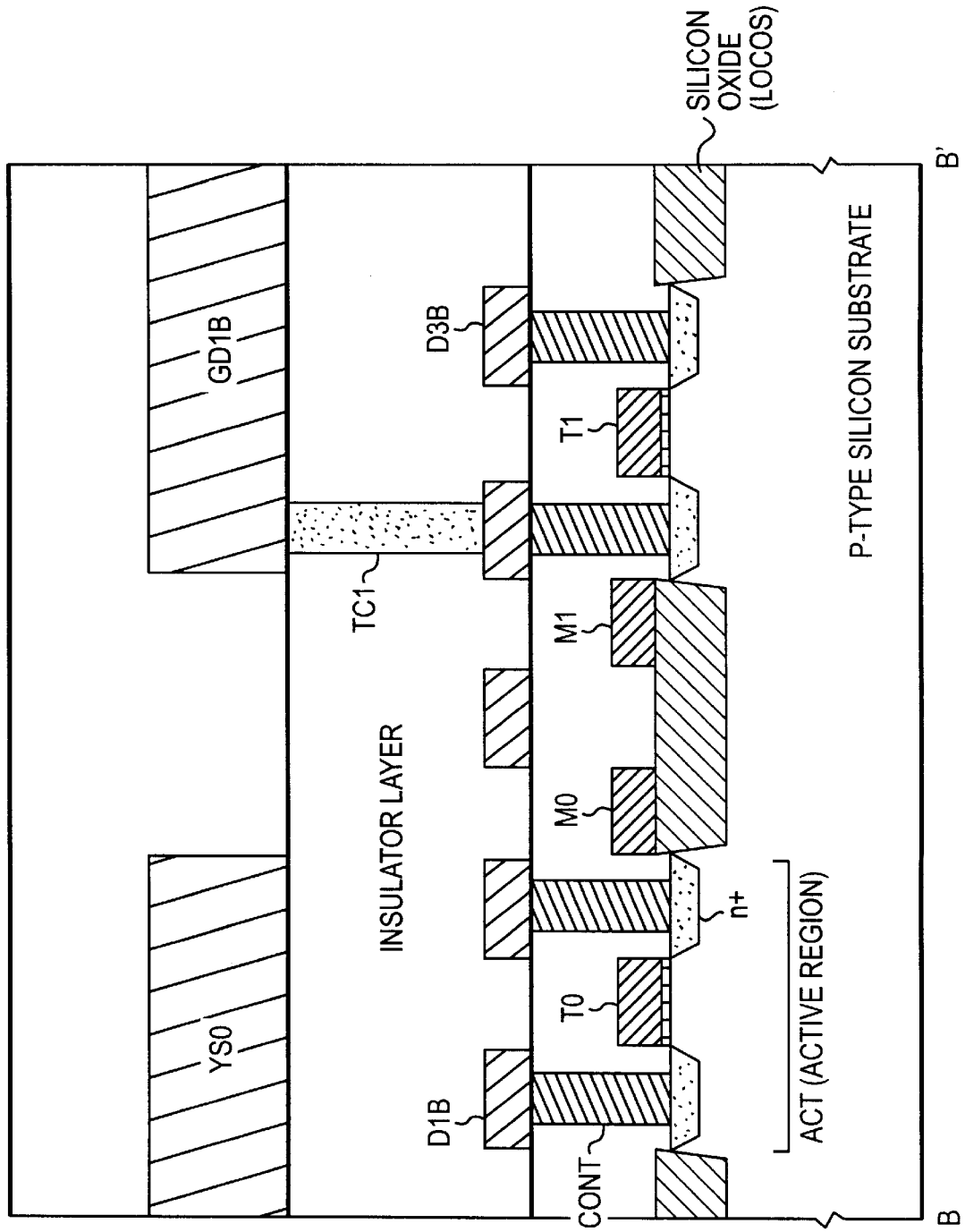
FIG. 9 is a cross sectional structure of a switch.

FIG. 2(b) shows a layout of switches in the memory array (6). FIG. 9 shows a cross-sectional structure taken along the line B—B' of FIG. 2(b).

As shown in the circuit diagram of FIG. 8, this embodiment requires only one pair of global data lines for two pairs of data lines. Normally, because miniaturization becomes more difficult for upper layers in the wiring layer fabricating process, the upper layers need to have greater line pitches. In the array of this embodiment, even when the global data lines and column selection line are formed using the same layer overlying the data lines, as shown in FIG. 9, the wiring pitch of this layer is greater than the wiring pitch of the underlying data line layer, thus satisfying the above requirement. Therefore, forming the global data lines and column selection line in the same wiring layer has the advantage of not increasing the number of wiring layers.

It is also possible to form the column selection line by using a wiring layer that is positioned further up above the global data line. In this case, the line pitch of the column selection line (YS) wiring layer can be widened, so that the coupling capacitance between the wires is reduced, increasing the transmission speed of signals.

In the cross-section of FIG. 9, if polysilicon, a compound of polysilicon and metal, and a metal with high melting temperature such as tungsten are used for a wiring material of MOS transistor gates (e.g., T1) and data lines (e.g., D1), there is an advantage in that these wires are not influenced by the high-temperature process of forming memory cells after the wiring process. The use of low resistance materials such as aluminum and copper for global data lines and the column selection line offers the advantage of minimizing signal delay. As shown in FIG. 9, word lines are formed in a gate layer defined by T0, M0, M1 and T1, which are formed above the silicon substrate. Data lines are formed in a first wiring layer located above the gate layer. Main data lines (or global data lines) are formed in a second wiring layer located above the first wiring layer. Column selection lines can also be formed in the second wiring layer, as shown in FIG. 9.

The memory access, i.e., the read and write operations to and from the memory cells as performed by the circuit of FIG. 8 will be explained by referring to FIGS. 10 and 11.

Figure 10:
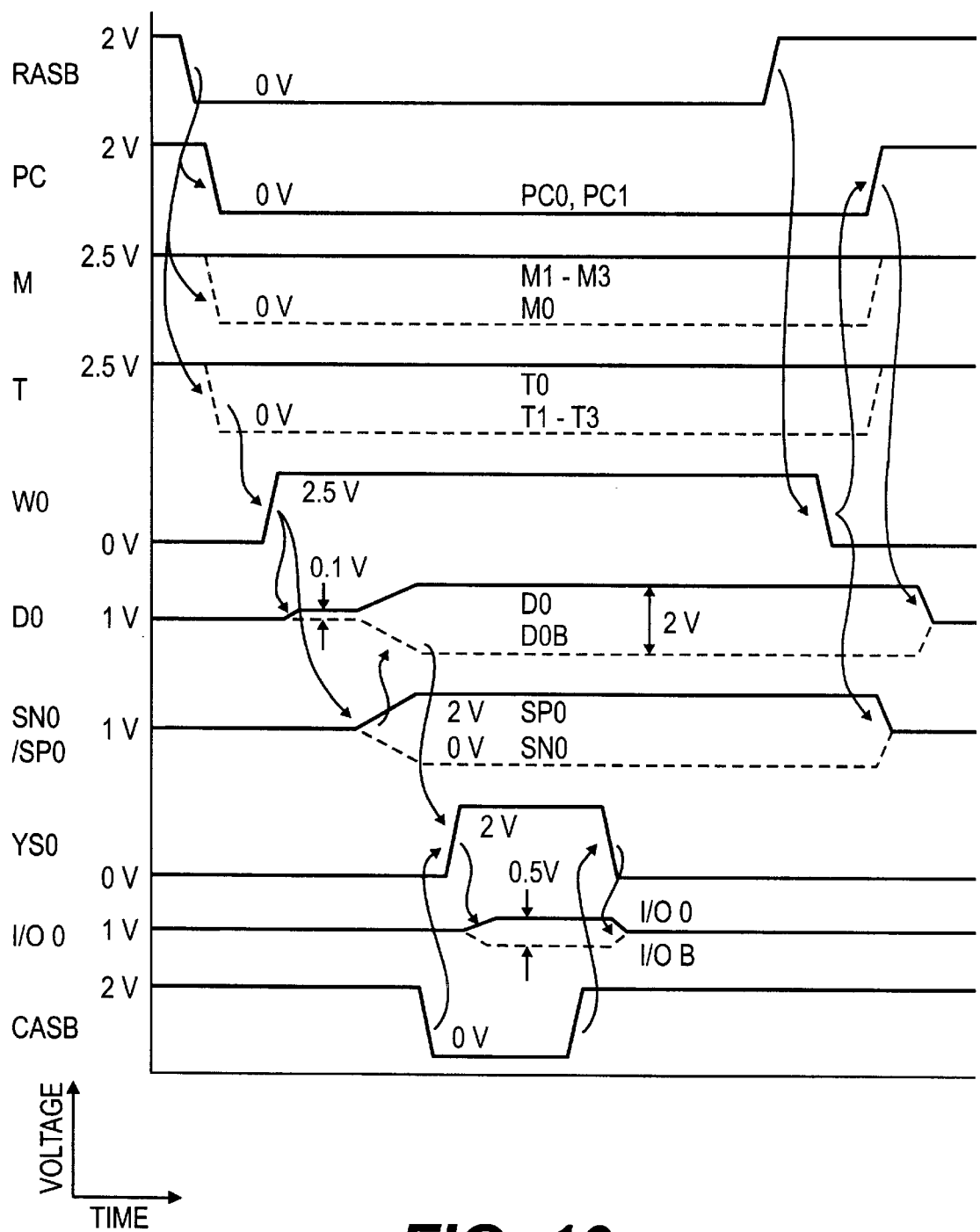
FIG. 10 shows read waveforms for the memory array (6)

FIG. 10 is a timing chart showing the read operation of the circuit of FIG. 8. Here, the process of reading data from an MC at the intersection of W0 and D0 is explained. In the initial state where RASB is at 2 V(Vdd), the precharge signals PC0, PC1 are at 2 V and the global data line separation switch control lines M0 to M3 and the data line connection switch control lines T0 to T3 are at 2.5 V(Vpp). All data lines are precharged to 1 V(Vdd/2) through global data lines. In this state, RASB is lowered to 0 V(Vss) to determine the row address, after which PC0, PC1, M0 and T1 to T3 are lowered to 0 V. M1 to M3 and T0 are left at 2.5 V. As a result, D0-D0B is connected to SA0 through DG0-DG0B, and D1-D1B is connected to SA1 through GD1-GD1B and GD2-GD2B, causing D0-D0B and D1-D1B to become floated. Other data lines are separated from global data lines. Then, W0 is raised to 2.5 V. As a result, the MC produces a signal of about 0.1 V onto D0, causing a potential difference between D0 and D0B. Then, by changing the sense amplifier NMOS drive line SN0 to 0 V and the sense amplifier PMOS drive line SP0 to 2 V, this potential difference is amplified by SA0. At the same time, a signal is also produced on D1 and is amplified by SA1. Because GD0 and GD1 are isolated by QM0T, data will not collide.

After the potential difference between D0 and D0B is amplified sufficiently, CASB is lowered to 0 V to determine the column address and YS0 is raised to 2 V to open column switch YG, thereby connecting GD0-GD0B and I/O0-I/O0B. I/O0-I/O0B is precharged to 1 V at the initial state but opening YG0 causes the complementary data on the GD0-GD0B to appear on I/O0-I/O0B. For increased speeds, RWC0 is provided with a bias circuit to reduce the amplitude of the signal on the I/O0-I/O0B to 0.5 V. RWC0 amplifies the complementary data on the I/O line pair and sends it to the output buffer, which in turn outputs the data to the outside of the chip. After CASB returns to 2 V, YS0 is returned to 0 V to close column switch YG. After RASB is returned to 2 V, WL0 is lowered to 0 V to write data from D0 and D1 into the memory cell again. After this, SN0, SP0, SN1, and SP1 are returned to 1 V and PC0, PC1, M0, and T1 to T3 are raised to 2.5 V to precharge D0-D0B and D1-D1B to 1 V again, thus completing the read cycle.

Figure 11:
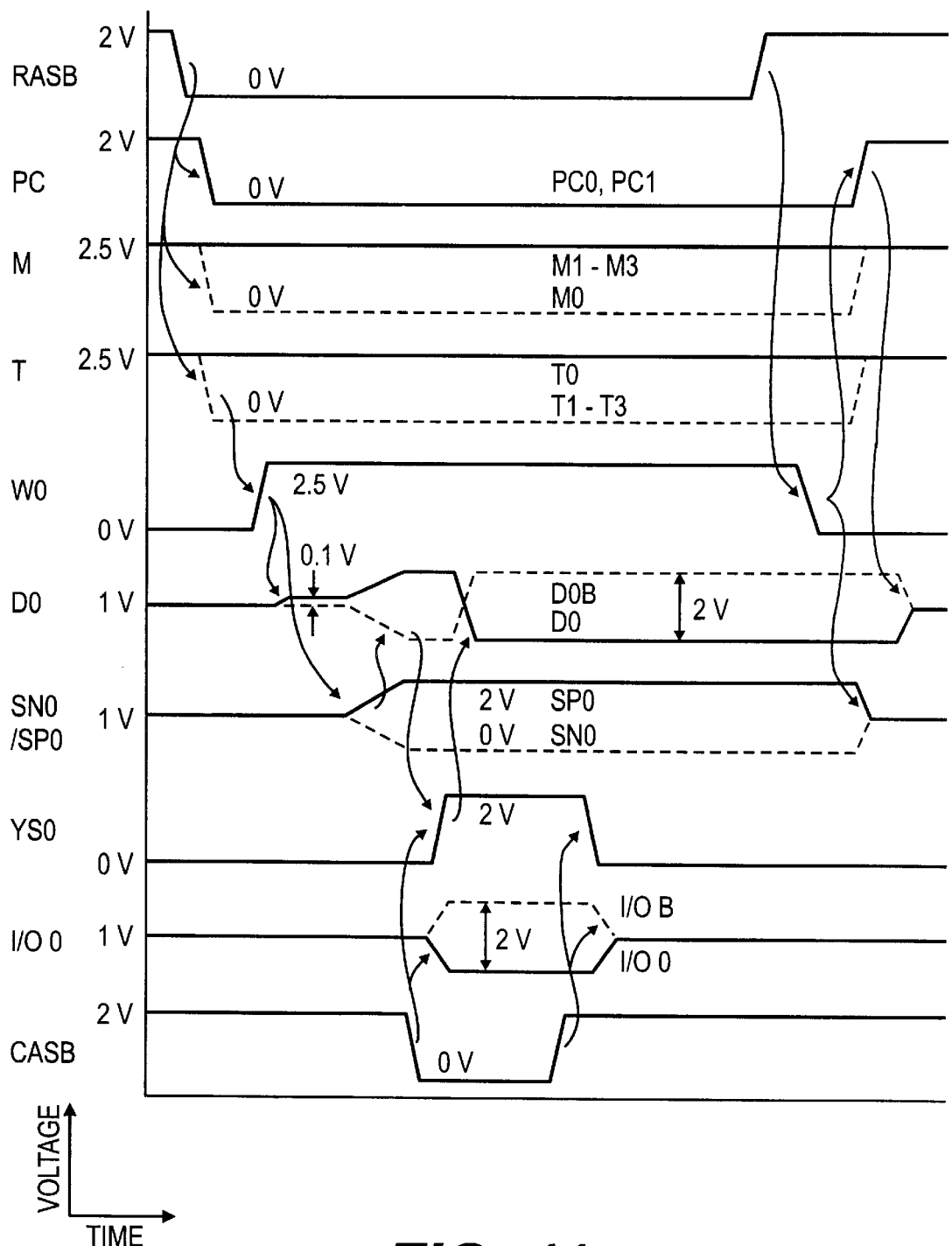
FIG. 11 shows write waveforms for the memory array (6)

FIG. 11 shows the write operation for writing data into a memory cell at the intersection between W0 and D0. First, controls similar to those of the above read operation are performed to read stored information from the memory cell. After the potential difference between D0 and D0B is amplified sufficiently by SA0, CASB is lowered to 0 V to determined the column address. This causes the I/O0-I/O0B to be complementarily driven by RWC according to the write data. At the same time YS0 is raised to 2 V to open YG0 to write data on the I/O0-I/O0B into D0-D0B through GD0-GD0B. After CASB has returned to 2 V, YS0 is returned to 0 V to close YG0. After RASB has returned to 2 V, the termination operation similar to that of the read cycle is carried out to complete the write cycle.

(Embodiment 7)

Figure 12:
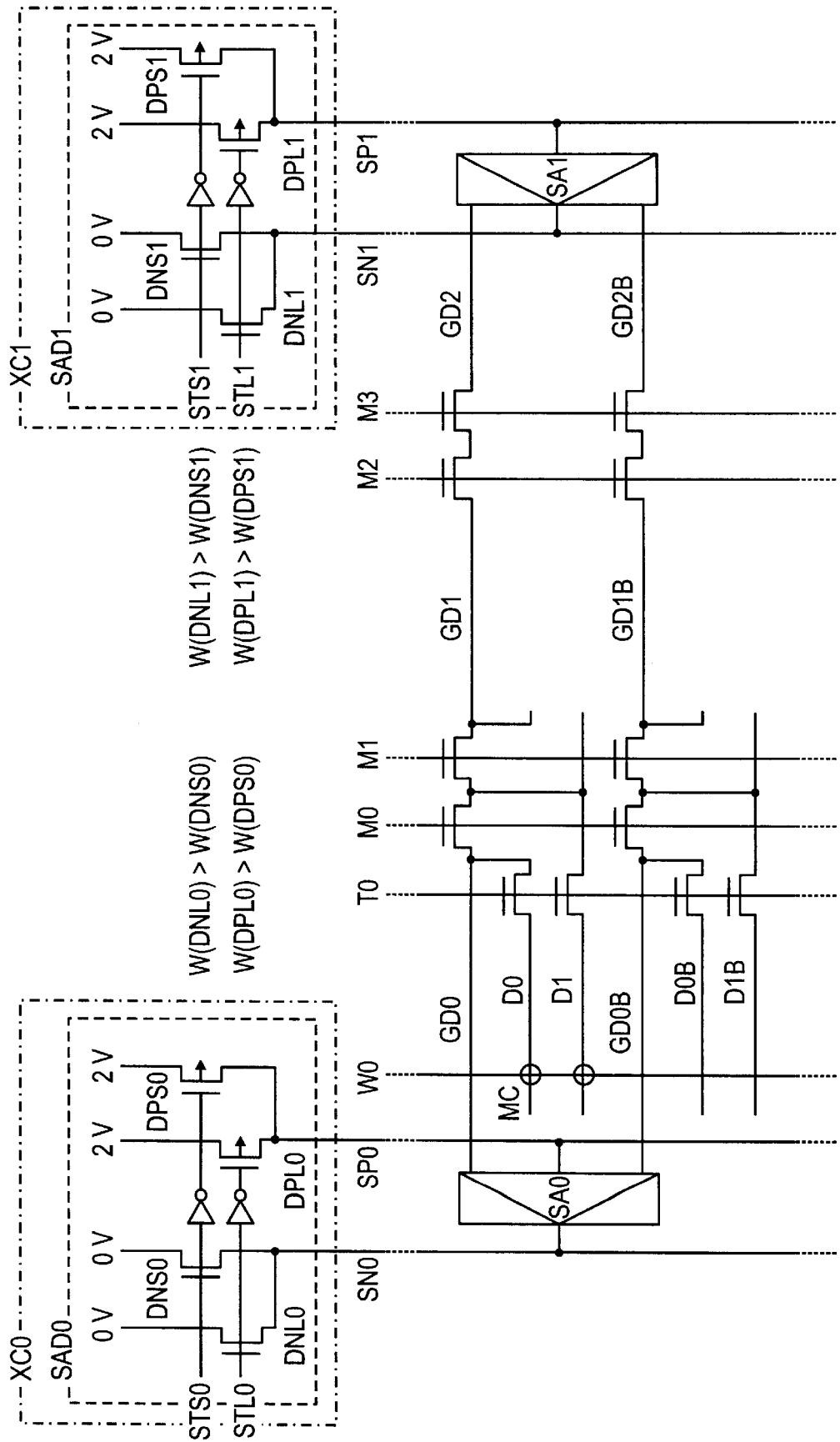
FIG. 12 shows a sense amplifier drive circuit.

FIG. 12 shows the sense amplifier drive circuit SAD in the switch-separated type hierarchical data line structure of this invention. This circuit is included in XC. A feature of this sense amplifier drive circuit is that the drive capability of the sense amplifier is varied as the load of the sense according to the open or closed state of the global word line separation switches. SAD0 includes NMOS transistors DNL0 and DNS0 for driving SN0 and PMOS transistors DPL0 and DPS0 for driving SP0. The current drive capability of DNL0 is set larger than that of DNS0. This may be achieved by making the gate lengths of DNL0 and DNS0 equal and the gate width of DNL0 greater. Namely, the conductance of DNL0 is larger than that of DNS0. Likewise, the current drive capability of DPL0 is set to be larger than that of DPS0. SAD1 has a similar configuration.

In FIG. 12, when word line W0 is selected, data line pair D0-D0B is connected to SA0 through a pair GD0-GD0B, and the pair D1-D1B is connected to SA1 through GD1-GD1B and GD2-GD2B. GD0 and GD2 are almost equal in length to a data line, whereas GD1 is two times as long as the data line. This means that the length of the global data line connected to SA0 is equal to that of the data line, while the length of the global data line connected to SA1 is three times the length of the data line. Hence, the parasitic capacitance coupled to the sense amplifier is greater for SA1 than for SA0.

FIG. 10 shows the timing chart for the read operation. In SAD0, STS0 is raised to 2 V to turn on DNS0 and DPS0, while in SAD1, STL1 is raised to 2 V to turn on DNL1 and DPL1. That is, for SA0 with a small load capacity, SN0 and SP0 are driven by DNS0 and DPS0, which have a small drive power. For SA1 with a large load capacity, SN1 and SP1 are driven by DNL1 and DPL1, which have a large drive power. This makes the amplification rates of SA0 and SA1 almost equal. When a word line crossing GD2 is selected, SA1 has a smaller load than SA0, so that STS1 and STL0 are raised to 2 V to drive SN0 and SP0 by DNL0 and DPL0 that have a large drive power.

The sense amplifier driver circuits SAD can be modified to the following. When the size of transistors DNS and DNL is the same, the variation of current is attained by the combination of the control signals STS and STL: turning ON only STS for small current mode and turning ON both STS and STL for large current mode. You might use the multi-step voltage control for STS such as 0V, 0.5V, 1V, 1.5V, and 2V. This might allow to delete DNL and DPL, if you choose appropriate transistor size for DNS and DPS. This scheme is also useful for precise control of the current for sense amplifier depending on the length of global data line. If you want full digital control for STS, you can use MOS transistors coupled in parallel for the same purpose.

Hence, this system has the advantage that even if there is an imbalance in the length between global data lines, there is no possibility of SA0, whose load is small, being amplified too fast, thereby keeping the S/N ratio from deteriorating.

Figure 13:
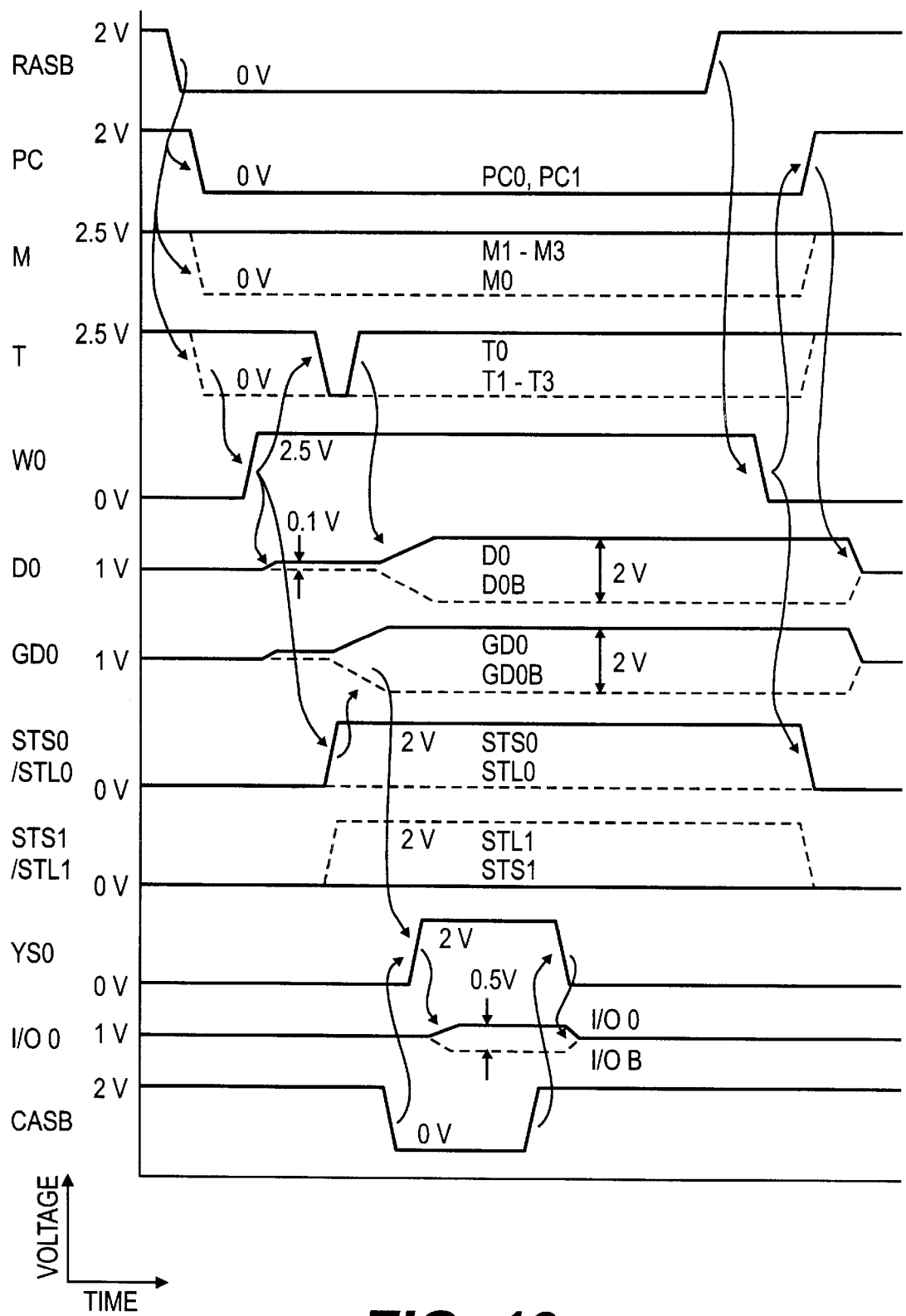
FIG. 13 shows read waveforms with an improved S/N ratio.

A drive system of FIG. 13 may be used to eliminate influences of the load imbalance due to cell capacitance between paired input lines of the sense amplifiers. After W0 is raised to 2.5 V to read signals onto D0 and GD0, T0 is lowered to 0 V instantaneously to raise the resistance of QT and start the sense amplifiers. Because the amplification is carried out with SA0 isolated from D0 and D0B with high resistance and the cell capacitance can hardly be seen from the sense amplifiers, the loads of the paired input lines becomes equal, increasing the S/N ratio.

In the above example, we have shown that where four data lines are arranged in the data line direction between the sense amplifiers, the imbalance in length between the global data lines connected to the sense amplifiers at both ends is 3:1. When, however, the memory chip capacity increases, a need arises to arrange eight data lines in the data line direction between the sense amplifiers to reduce the number of sense amplifiers. In that case, the imbalance of global data line lengths increases to as large as 7:1, so that the control method described-above becomes all the more important.

(Embodiment 8)

Figure 14:
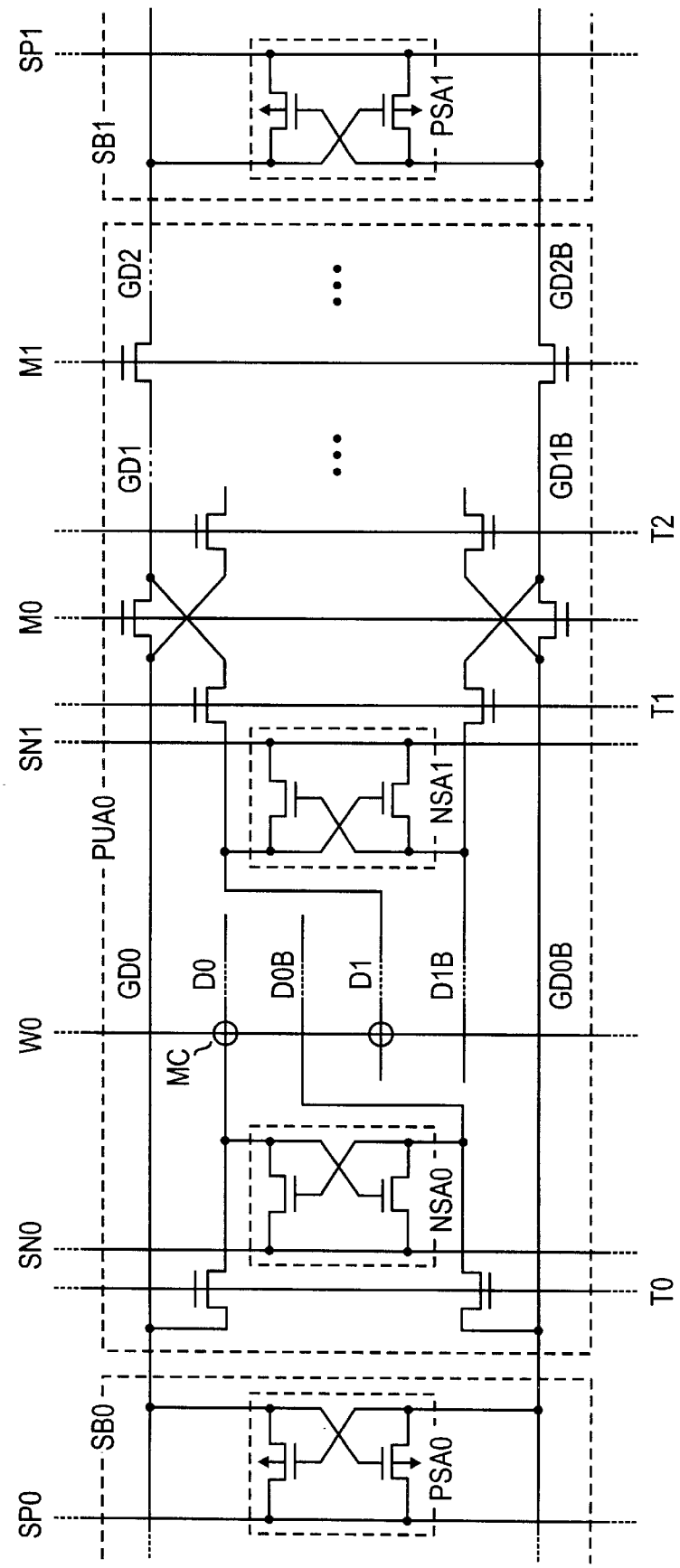
FIG. 14 is a circuit diagram of a memory array (7) of this invention.

FIG. 14 shows a memory array (7) of this invention, that uses a variation of PUAO of FIG. 8 with some parts not shown. This embodiment is a variation of the array (4) of FIG. 5. When N-channel MOS transistors are used as transfer gates of memory cells, this embodiment has an NMOS sense amplifier NSA, rather than a CMOS sense amplifier SA, on the data lines and a PMOS sense amplifier PSA in the sense amplifier block on the global data lines in the array (4) of FIG. 5. Other data line pairs have the similar configuration to that of D0-D0B and D1-D1B. Because both the memory cell and the NMOS sense amplifier NSA use N-channel MOS transistors, the arranging of the NMOS sense amplifier NSA on data lines eliminates the need to provide an N/P isolation region for each data line. The N/P isolation region is required on only the PMOS sense amplifier PSA portion on global data lines. Hence, arranging the NMOS sense amplifier NSA on data lines causes little increase in the chip area. When PMOS is used as the transfer gate of a memory cell, a PMOS sense amplifier PSA instead of the CMOS sense amplifier SA is provided on the data lines, and an NMOS sense amplifier NSA in the sense amplifier block on the global data lines in the array (4) of FIG. 5.

During the read operation, after precharging is stopped, T0 to T7 are all closed and W0 is activated to read signals onto D0 and D1. Then, SN0 and SN1 are lowered to 0 V to amplify the signals. At this time the paired data lines are amplified almost to 0 V and 1 V. Then, T0 and T1 are opened to read signals onto GD0 and GD1, after which SP0 and SP1 are raised to 2 V to amplify the data lines to 0 V and 2 V, respectively.

By performing the initial amplification on the data lines in this manner, the influences of the parasitic capacitance of global data lines on the S/N ratio can be reduced. This embodiment therefore is effective to enhance S/N when the chip capacity is increased and the primitive unit memory array (PUA) becomes long.

Because this array has the data line connection switches (QT) arranged in alternate positions, it is possible to set length of the NMOS sense amplifiers (NSAs) in the word line direction equal to two pairs of data lines.

(Embodiment 9)

Figure 15:
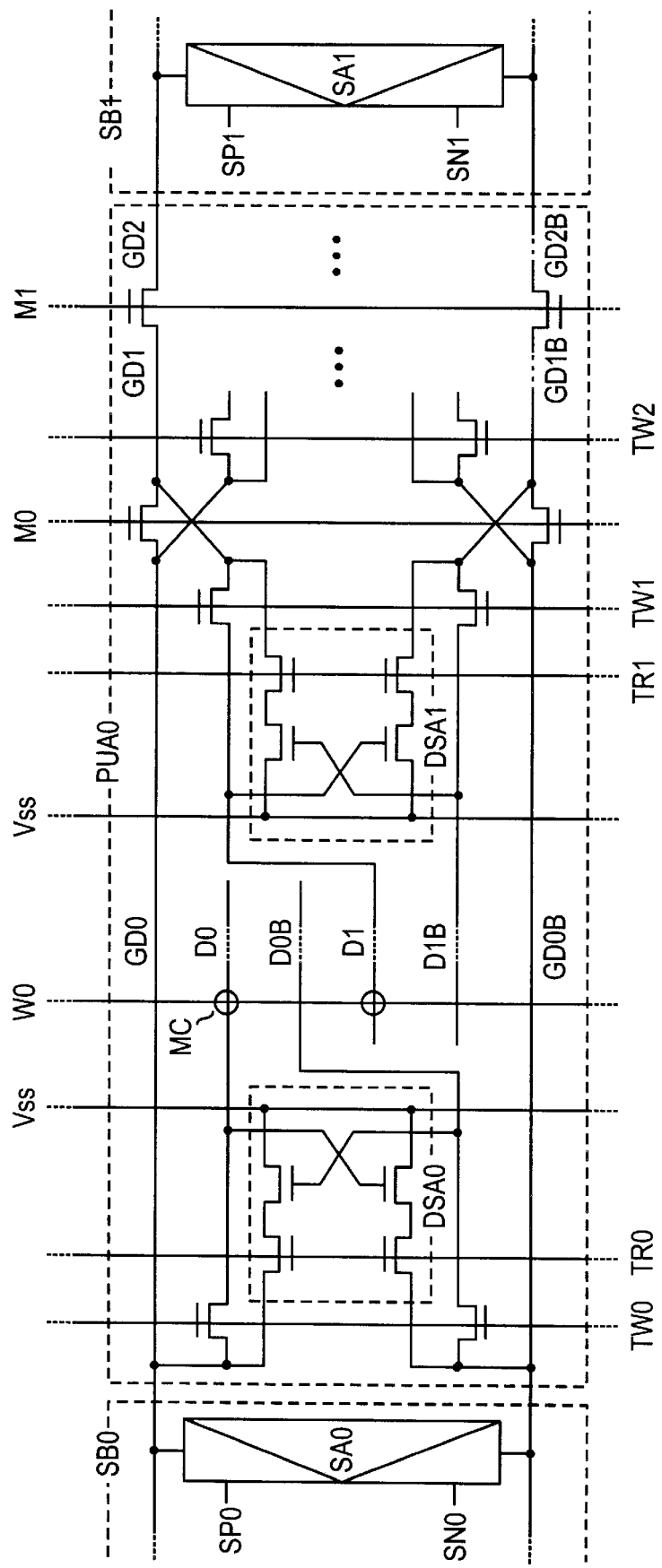
FIG. 15 is a circuit diagram of a memory array (8) of this invention.
Figure 16:
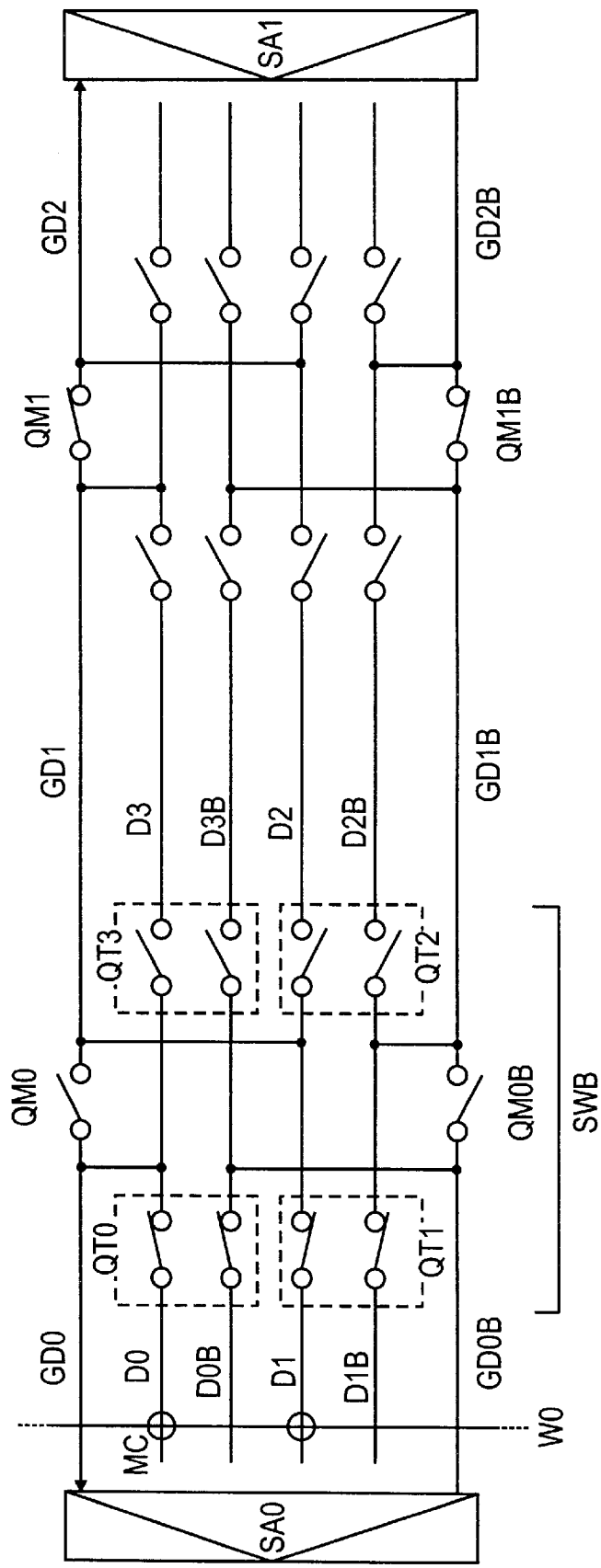
FIG. 16 is a circuit diagram of a conventional memory array.

FIG. 15 shows a memory array (8) of this invention. This figure shows a variation of PUAO of FIG. 8 with some parts not shown. This embodiment is a variation of the array (4) of FIG. 5. When N-channel MOS transistors are used as transfer gates of memory cells, this embodiment provides an NMOS sense amplifier DSA on the data lines and a CMOS sense amplifier SA in the sense amplifier block on the global data lines. Here, NMOS sense amplifier DSA is a voltage-to-current converter circuit (or voltage-to-current conversion type sense amplifier circuit). Other data line pairs have the similar configuration to that of D0-D0B and D1-D1B. Because both the memory cell and the NMOS sense amplifier DSA use NMOS transistors, arranging NMOS sense amplifier DSA on the data lines eliminates the need for providing an N/P isolation region for each data line. The NIP isolation region is required only for the sense amplifier portion on the global data lines; Hence, providing the NMOS sense amplifier DSA on the data lines will result in only a slight increase in the chip area. When PMOS is used for the transfer gate of a memory cell, a PMOS sense amplifier DSA is provided on the data lines.

During precharging, all write related data line connection switch control lines (TW) are at 2.5 V, all read related data line connection switch control lines (TR) are at 0 V, and M0 and M1 are at 2.5 V. When reading data from memory cells at the intersections between W0 and D0 and D1, the precharge is stopped and then all TWs are lowered to 0 V, TR0 and TR1 are raised to 2.5 V, and M1 is lowered to 0 V. W0 is raised to 2.5 V to read a signal onto D0 and the voltage difference between D0 and D0B is converted into a current difference by DSA0. The current difference between GD0 and GD0B is transmitted to RWC0 through YG and I0 in SB0 by raising YS to 2 V. At the same time, SP0 of SA0 is driven to 2 V and SN0 to 0 V to amplify GD0 and GD0B to 0 V and 2 V, respectively. The signal on D1 is similarly processed by SB1. During the rewriting process, TR0 and TR1 are lowered to 0 V and TW0 and TW1 are raised to 2.5 V to write a voltage of 0 V or 2 V into the memory cells.

By performing the voltage-to-current conversion in the data lines, the influences of parasitic capacitance of global data lines on S/N can be eliminated. Therefore, this embodiment is effective to enhance S/N when, for example, chip capacity is increased and the primitive unit memory array PUA becomes long. Because information is not read out undesirably even when TR and YS are raised before W is raised to 2.5 V, the timing margin at this portion is eliminated, assuring a faster reading operation.

Further, because this array has the data line connection switches (QT) arranged at alternate positions, it is possible to make the length of each NMOS sense amplifier DSA in the word line direction as long as two data line pairs, facilitating the design of layout.

(Embodiment 10)

As described in the above embodiment, when YS is laid for each pair of global data lines, the coupling noise from other global data line pairs can be shielded. However, when the minimum allowable pitch for the wiring layer of global data lines and YS is large so that YS can only be wired for a plurality of global data line pairs, the coupling noise from other global data line pairs poses a problem.

Figure 19:
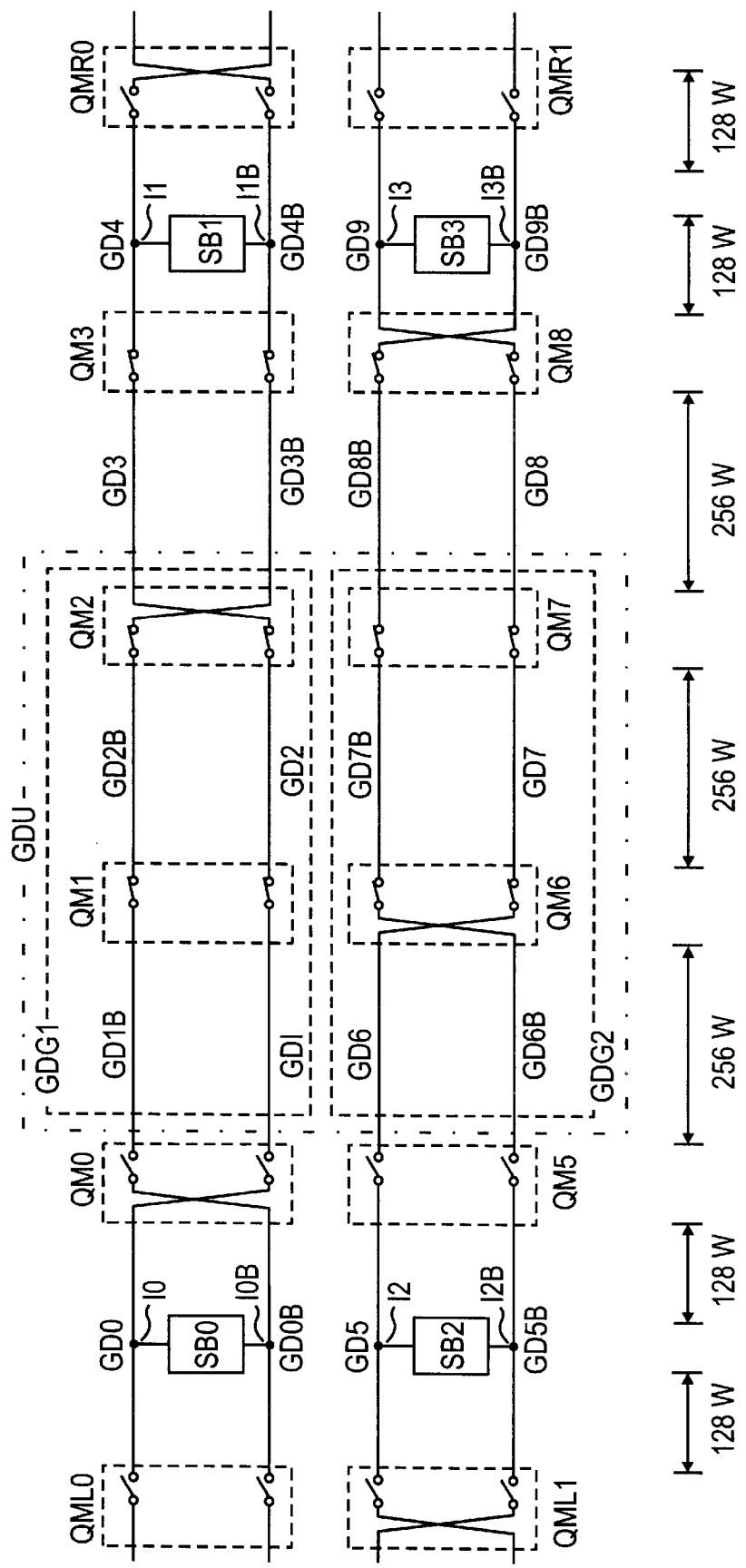
FIG. 19 shows twisted global data lines (1) of this invention.

FIG. 19 shows twisted (or transposed) global data lines (1) of this invention. This is an example in which global data lines are twisted to reduce the coupling noise between global data lines. In the diagram, the length of a global data line corresponds to 1024 word lines and the length of a data line corresponds to 128 word lines. The sense amplifier block SB includes a CMOS sense amplifier, a precharge circuit and a column switch, all shown in FIG. 8. This diagram does not show data lines and data line connection switches.

As shown in FIG. 19, the memory array has the following configuration. Two global data lines and two global data line separation switches together-form a group of global data lines GDG. Two such groups (GDGs) form a global data line unit GDU. The memory array has the GDU repetitively arranged in the data line direction and in the word line direction. At least two sense amplifier blocks SB are connected to each column of global data lines in which GDGs are arranged in the data line direction.

In GDG1, global data lines are twisted in the region of QM2 and, in GDG2, are twisted in the region of QM6. In the case of the switch-separated type, global data lines are twisted in the region of SWB1 in FIG. 1. In the alternating-positioning-switch type, they are twisted in the region of SWB4 of FIG. 5.

This embodiment can also be described in another way. First, there is a first main data line pair, which is then divided into a plurality of parts of equal lengths (five sections of GD0, GD1, GD2, GD3 and GD4). The dividing points are connected by main data line separation switches (QL0, QM0, QM1, QM2, QM3, QMR0). The same is done to a second main data line pair neighboring the first main data line pair. Lastly, as for the first main data line pair, the main data line separation switches are assigned from left to right with numbers beginning with 1 (note that the numbers do not correspond to the reference numerals), and the paired main data lines are twisted near or inside the even-numbered main data line separation switches (QM0, QM2, QMR0). Conversely, in the second main data line pair, the paired main data lines are twisted near or inside the odd-numbered main data line separation switches (QML1, QM6, QM8). By setting the divided sections of the main data line pair equal in length and shifting the twisting positions of the adjoining main data line pairs by a half cycle in this manner, the coupling noise can be canceled out effectively.

What differs in this embodiment from the conventional example is that GD0, for example, is not separated at SB0 but is extended to the array on the opposite side, that global data lines on both sides share SB and are separated by QM in the array on the opposite side. Hence, all global data lines are almost equal in length and cross almost the same number of word lines. Further, the connection position of SB is set at nearly the middle of the global data lines.

With the global data line twisting method of this invention, no coupling imbalance occurs in the worst case assuring a complete canceling of noise. When a redundant circuit is used, there may be cases where the number of word lines crossed by global data lines differs in the range of several word lines or the SB connection position shifts from the center by several lines according to individual global data lines. This degrallow imbalance, however, will result in an allowable coupling noise.

Let us consider a case where in FIG. 19 QM0 and QM5 are turned off and other global data line separation switches are turned on, resulting in the worst case scenario that renders the read signal to the lowest level for SB1 and SB3. The global data lines of the neighboring mat are separated as by QML0 and QMR0. Thus all global data lines have a 256 W length. Suppose that, in a condition where global data lines are precharged to 1 V and floating, SA in SB1 is activated to amplify the sense amplifier node I1 to 2 V and I1B to 0 V. At this time, consider the coupling noise that the global data lines connected to I3 and I3B receive. As for I3, GD9 receives a negative coupling from GD4B, and GD6 receives a positive coupling from GD1. GD9 and GD6 are both 256 W long and thus their positive and negative couplings are canceled out. Next, as for I3B, GD8B receives a negative coupling from GD3B, and GD7B receives a positive coupling from GD2. However, GD8B and GD7B are both 256 W long and thus their positive and negative couplings are canceled out. Because the noise I3 and I3B receive are canceled out, the operation margin of SA in SB3 does not deteriorate.

Conversely, let us consider the coupling noise that global data lines connected to I1 and I1B receives when SA in SB3 is activated to amplify the sense amplifier node I3 to 2 V and I3B to 0 V. As to I1, GD2 receives a negative coupling from GD7B, and GD1 receives a positive coupling from GD6. Because GD2 and GD1 are both 256 W long, the positive and negative couplings are canceled. Next, as for I1B, end GD4B receives a positive coupling from GD9, and GD3B receives a negative coupling from GD8B. Because GD4B and GD3B are both 256 W long, the positive and negative couplings are canceled. Thus, even in this case, the noise I1 and I1B receive are canceled out, keeping the operation margin of SA in SB3 from degrading.

The twisted global data lines of this invention has the advantage of no coupling imbalance in the worst case and of being able to cancel noise completely.

Figure 21:
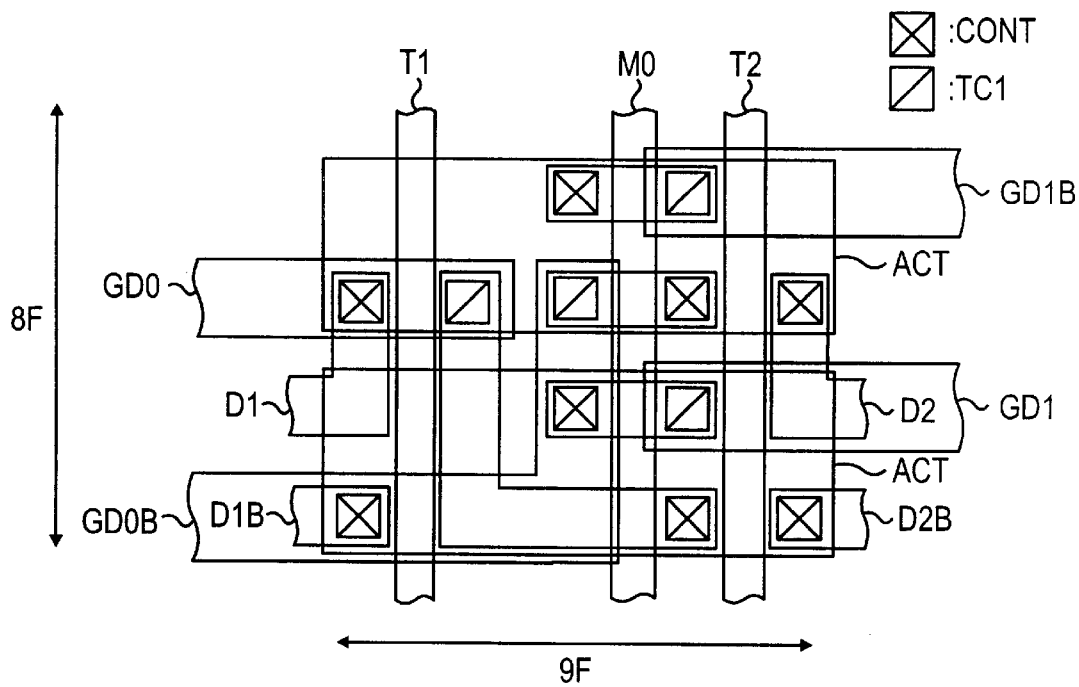
FIG. 21 is a layout of a switch for the twisted global data lines (1) of this invention.

FIG. 21 shows a switch layout of the alternating-positioning-switch type when the global data lines are twisted at SWB4 in FIG. 5. This can be laid out in the length of 9 F in the data line direction, realizing the data line twisting with small overhead compared with 7 F of FIG. 18.

(Embodiment 11)

Figure 20:
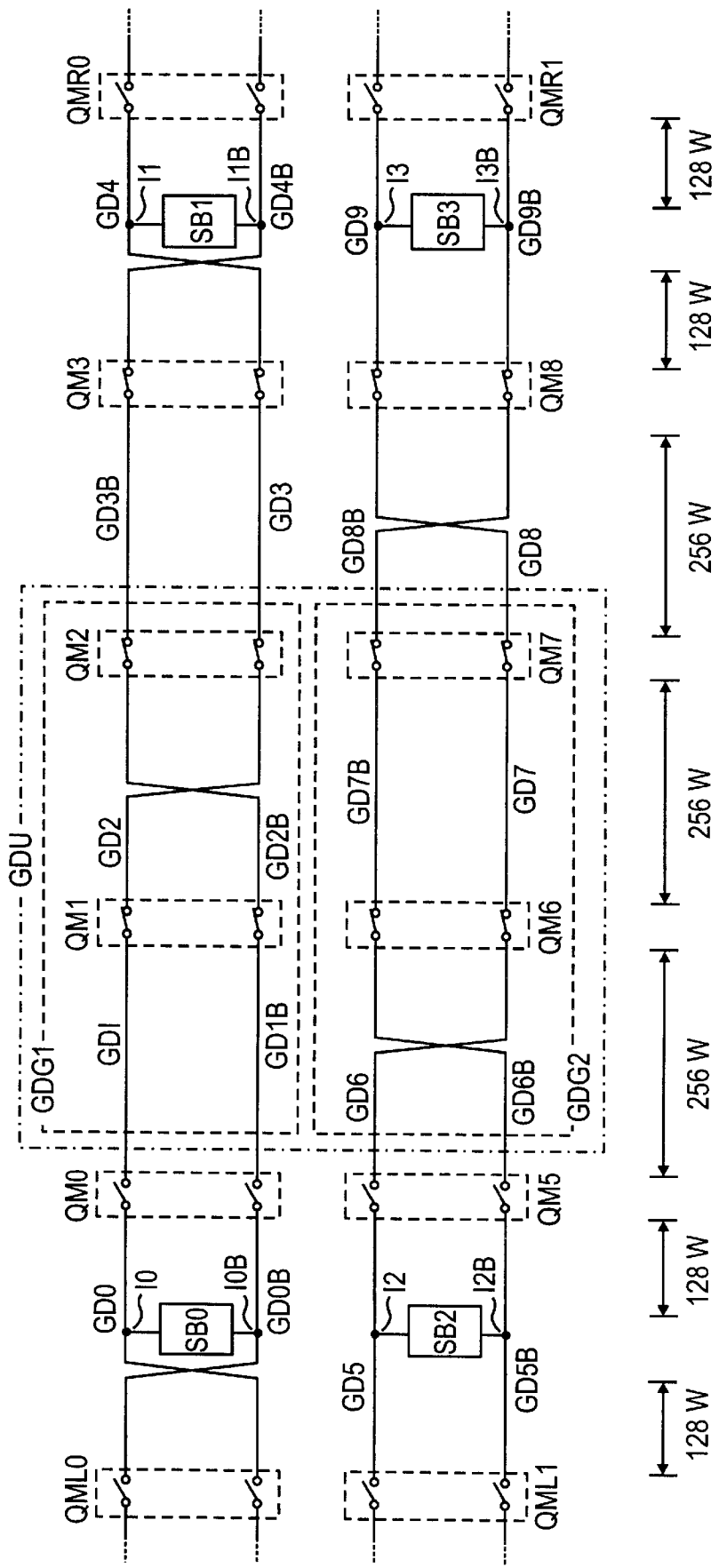
FIG. 20 shows twisted global data lines (2) of this invention.

FIG. 20 shows twisted global data lines (2) of this invention. As in Embodiment 10, GD has a length of 1024 word lines and D has a length of 128 word lines. The sense amplifier block SB includes a CMOS sense amplifier, a precharge circuit and a column switch, all shown in FIG. 8. Data lines and data line connection switches are not shown.

As shown in the figure, the memory array is constructed as follows. Two global data lines (GDs) and two global data line separation switches (QMs) form a global data line group GDG. Two GDGs form a global data line unit GDU. The memory array has the GDU repetitively arranged in the data line direction and in the word line direction. At least two sense amplifier blocks SB are connected to each column of global data lines in which GDGs are arranged in the data line direction.

In this embodiment, GDG1 has its global data lines twisted at the middle of GD2, and GDG2 has its global data lines twisted at the middle of GD6. The twisting position is located in a region of SB and, in the switch-separated type, at the mid-point of GD1 of FIG. 1 and, in the alternating-positioning-switch type, at SWB5 of FIG. 5. As can be seen from comparison with FIG. 19, the main data lines are divided into sections of equal lengths as in the previous embodiment. While in FIG. 19 the twisting position is set near the global data line separation switches at the main data line dividing positions, this embodiment has the twisting position at the mid-point between the dividing positions.

In this embodiment, too, as in the previous embodiment, GD0 is not separated at SB0 but extended to the array on the opposite side. Global data lines on both sides share SB and are separated by global data line connection switches in the array on the opposite side. Hence, all global data lines are almost equal in length and cross roughly the same number of word lines. Further, the connection position of SB is set at almost the middle of the global data line. When a redundant circuit is used, the number of word lines that global data lines cross may vary by several word lines depending on the individual global data lines. This degree of coupling imbalance will result in an allowable coupling noise.

In this embodiment, the twisting is done at the central part of global data lines so that the neighboring global data lines, such as GD1-GD1B and GD6-GD6B, can cancel their noise. This offers the advantage that not only in the worst case but also when data is read out from any data lines there is no coupling imbalance so that noise can be canceled out completely.

Let us consider an example case where in FIG. 20 QM0 and QM5 are turned off and other global data line separation switches (QMs) are turned on, the worst case that makes the read signal level lowest. The global data lines of neighboring mats are separated by QML0 and QMR0. Thus, all global data lines are 256 W long. Suppose that, in the condition where global data lines are precharged to 1 V and-are floating, SA in SB1 is activated to amplify a sense amplifier node I1 to 2 V and I1B to 0 V. At this time, consider the coupling noise that global data lines connected to I3 and I3B receive. First, GD6 and GD6B both receive a negative coupling from GD1B. Because the GD portions receiving the coupling are equal in length, I3 and I3B produce noise of the same magnitudes and phases. Thus, the operation margin of SA will not deteriorate. This also applies when GD8 and GD8B both receive a positive coupling from GD3. Of GD7 and GD7B, only GD7B receives a coupling noise. It receives a positive coupling from GD2 and a negative coupling from GD2B, and these couplings are of equal magnitudes and therefore cancel each other out. The same is true of GD9. Therefore, the noise that I3 and I3B receive are canceled and the operation margin of SA in SB3 will not deteriorate.

Conversely, let us consider the coupling noise that global data lines connected to I1 and I1B receive when SA in SB3 is activated to amplify the sense amplifier node I3 to 2 V and I3B to 0 V. First, GD2 and GD2B both receive a negative coupling from GD7B. Because the GD portions receiving the coupling are equal in length and the noise produced at I1 and I1B are of the same phases and magnitudes, the operation margin of SA will not be degraded by this coupling. This also applies when GD4 and GD4B are both subjected to a positive coupling from GD9. As to GD1 and GD1B, only GD1B receives coupling noise. It is subjected to a positive coupling from GD6 and a negative coupling from GD6B, and these couplings are of equal magnitudes and thus cancel each other out. The same is true of GD3. Therefore, the noise to which I1 and I1B are subjected are canceled and the operation margin of SA in SB1 will not deteriorate.

It is easily understood that, because noise is canceled between individual global data lines, the noise cancellation is ensured even when the global data lines are separated by different global data line separation switches.

The twisted global data lines of this invention, therefore, offer an advantage in that no coupling imbalance occurs, whichever data lines signals are read from, thus assuring complete canceling of noise.

Figure 22:
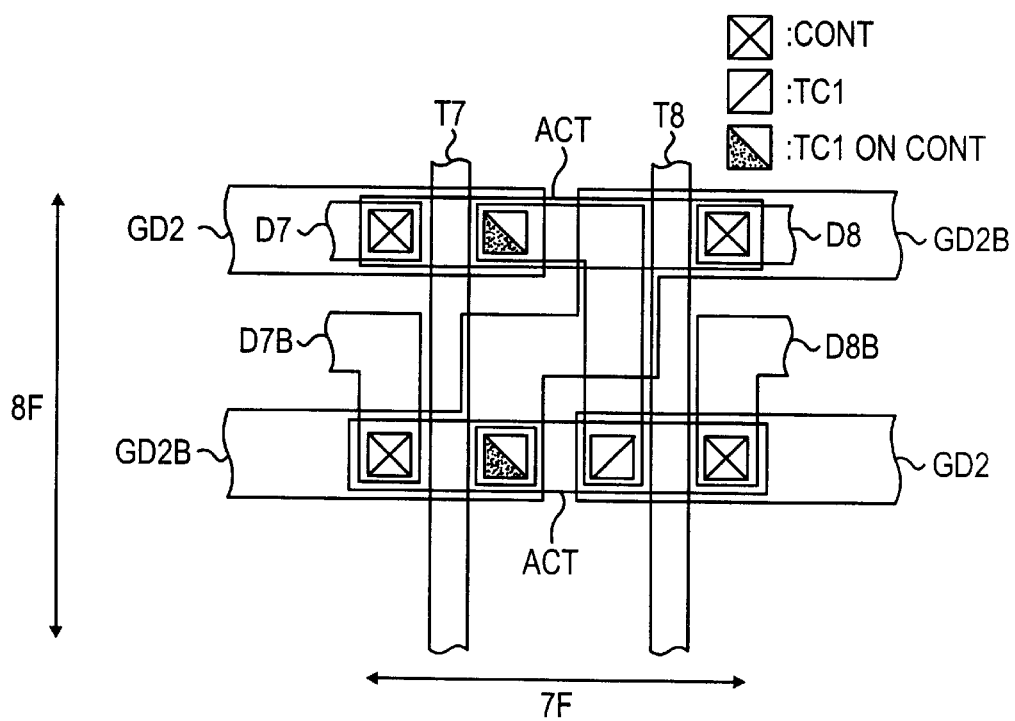
FIG. 22 is a layout of a switch for the twisted global data lines (2) of this invention.
Figure 23:
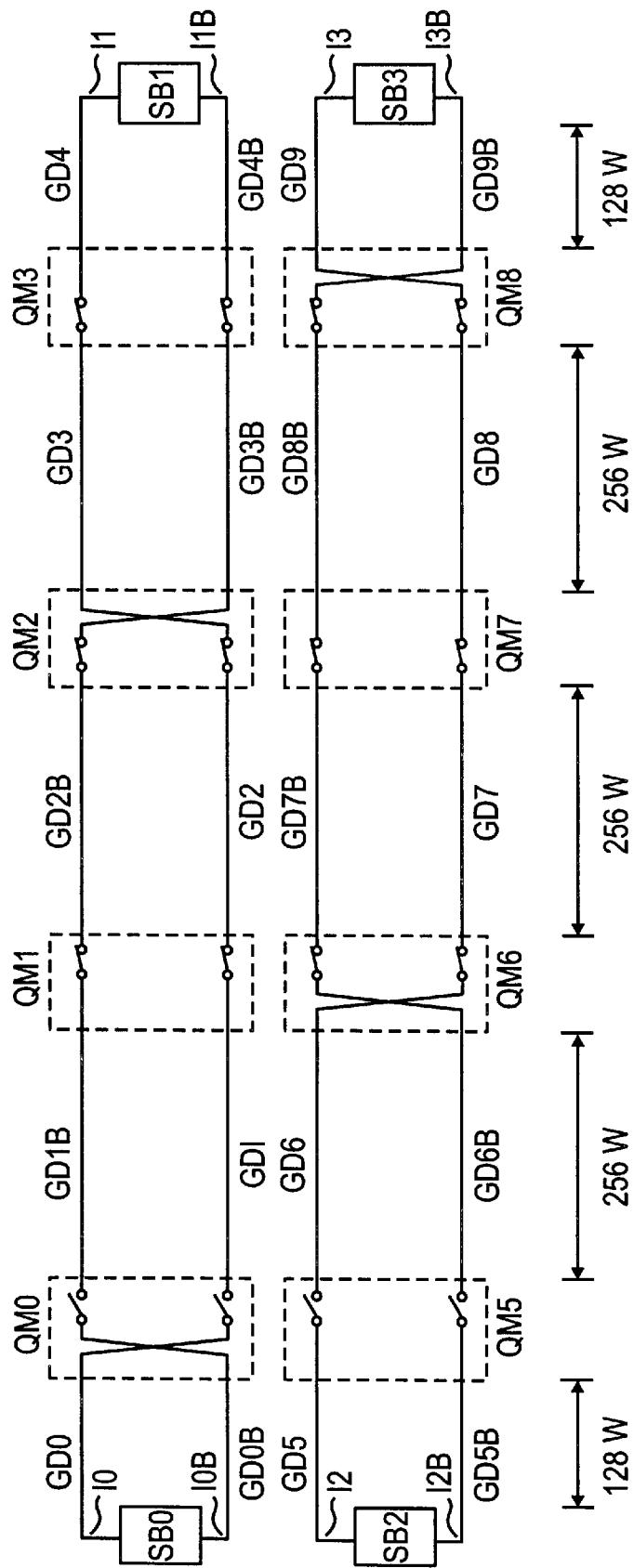
FIG. 23 shows conventional twisted global data lines.

FIG. 22 shows a layout of switches of the alternating-positioning-switch type when global data lines are twisted at SWB5 portion in FIG. 5. This can be formed in the length of 7 F in the data line direction and the data line twisting can be realized with small overhead compared with 5 F of FIG. 18(b).

With the above array configuration and operation system, it is possible to realize a DRAM that has a small chip area and a reduced power consumption. That is, this configuration can divide data lines into multiple sections virtually without increasing the chip area and can also reduce power consumption.

What is claimed is:

1. A semiconductor memory comprising a plurality of unit memory arrays,
   wherein each unit memory array includes:
      a first sense amplifier;
      a first memory block;
      a switch block neighboring the first memory block;
      a second memory block neighboring the switch block; and
      a second sense amplifier,
   wherein each of the first and second memory blocks includes:
      a first data line extending in a first direction;
      a second data line in parallel to the first data line;
      a main data line in parallel to the first data line;
      a plurality of word lines crossing the first and the second data line and extending in a second direction; and
      a plurality of memory cells, each memory cell being placed at a predetermined crossing point of the plurality of word lines and the first and second data lines,
   wherein the first sense amplifier is coupled to the main data line of the first memory block,
   wherein the second sense amplifier is coupled to the main data line of the second memory block, and
   wherein the switch block includes first and second switches, one end of the first switch being coupled to one end of the second switch at a coupling node, another end of the first switch being coupled to the main data line of the first memory block, and another end of the second switch being coupled to the main data line of the second memory block.

2. A semiconductor memory according to claim 1,
   wherein each of the first and second data lines has a folded data line structure, and
   wherein the main data line is a complimentary pair of main data lines.

3. A semiconductor memory according to claim 2,
   wherein the switch block includes a third switch coupling together the first data line of the first memory block and the main data line of the first memory block, and
   a fourth switch coupling together the second data line of the first memory block and the coupling node between the first and second switches.

4. A semiconductor memory according to claim 3,
   wherein one side of the switch block is adjacent to the first memory block, and
   wherein another side of the switch block is adjacent to the second memory block.

5. A semiconductor memory according to claim 4, further comprising a plurality of column selection lines extending in the first direction,
   wherein the first data line has a non-inverted first data line and a inverted first data line, the second data line having a non-inverted second data line and a inverted second data line, and the main data line having a non-inverted main data line and a inverted main data line,
   wherein the non-inverted and inverted first data lines and the non-inverted and inverted second data lines are formed in a first wiring layer, and form four data lines,
   wherein the non-inverted and inverted main data lines and the plurality of column selection lines are formed in a second wiring layer above the first wiring layer,
   wherein a first width between the non-inverted and inverted main data lines is twice that of a second width between the nearest neighboring two of the four data lines, and
   wherein a third width between nearest neighboring two of said plurality of column selection lines is at least three times that of the second width.

6. A semiconductor memory according to claim 4, further comprising a plurality of column selection lines extending in the first direction,
   wherein the first data line has a non-inverted first data line and a inverted first data line, the second data line having a non-inverted second data line and a inverted second data line, and the main data line having a non-inverted main data line and a inverted main data line,
   wherein the non-inverted and inverted first data lines and the non-inverted and inverted second data lines are formed in a first wiring layer, and form four data lines,
   wherein the non-inverted and inverted main data lines are formed in a second wiring layer above the first wiring layer,
   wherein the plurality of column selection lines is formed in a third wiring layer above the second wiring layer,
   wherein a first width between the non-inverted and inverted main data lines is twice that of a second width between the nearest neighboring two of the four data lines, and
   wherein a third width between nearest neighboring two of said plurality of column selection lines is at least three times that of the second width.

7. A semiconductor memory according to claim 3,
   wherein in the first memory block, one of the plurality of word lines selects a first memory cell at a crossing point of the first data line and a second memory cell at a crossing point of the second data line, and
   wherein data of the first and second memory cells are amplified by the first and second sense amplifiers, respectively, by turning OFF the first switch and turning ON the second, third, and fourth switches.

8. A semiconductor memory according to claim 7,
   wherein during from a first timing when the one of the plurality of word lines selects the first memory cell to a second timing when the first and second sense amplifier are activated, the third switch is turned OFF in a predetermined period.

9. A semiconductor memory according to claim 7,
   wherein each of the first and second sense amplifiers has cross coupled P-type MOS transistors, and
   wherein each of the first and second data line is coupled to an amplifier having cross coupled N-type MOS transistors.

10. A semiconductor memory according to claim 7,
    wherein each of the first and second data lines is coupled to a voltage-to-current conversion type sense amplifier.

11. A semiconductor memory according to claim 7,
wherein each of the plurality of memory cells comprises a MOS transistor and a capacitor.

12. A semiconductor memory according to claim 2, wherein the switch block also includes:
   a third switch coupling together the first data line of the first memory block and the main data line of the first memory block;
   a fourth switch coupling together the second data line of the first memory block and the coupling node between the first and second switches;
   a fifth switch coupling together the first data line of the second memory block and the main data line of the second memory block; and
   a sixth switch coupling together the second data line of the second memory block and the coupling node between the first and second switches,
   wherein the third, first, second, and fifth switches are arranged in order adjacent to each other and along the first direction,
   wherein the fourth switch is arranged adjacent to the third switch and along the second direction,
   wherein the sixth switch is arranged adjacent to the fifth switch and along the second direction, and
   wherein the plurality of the word lines are formed in a gate layer, the first and second data lines being formed in a first wiring layer above the gate layer, and the main data line being formed in a second wiring layer above the first wiring layer.

13. A semiconductor memory according to claim 1, further comprising:
   first and second sense amplifier drive circuits coupled to power receiving nodes of the first and second sense amplifiers, respectively,
   wherein each of said plurality of unit memory arrays also includes:
      a third memory block neighboring the second memory block;
   another switch block neighboring the third memory block;
   a fourth memory block neighboring the second switch block,
   wherein each of the third and fourth memory blocks includes: a first data line; a second data line; a main data line; a plurality of word lines; and a plurality of memory cells,
   wherein the main data line of the second memory block is coupled to the main data line of the third memory block,
   wherein the another switch block includes third and fourth switches, one end of the third switch being coupled to one end of the fourth switch, another end of the third switch being coupled to the main data line of the third memory block, and another end of the fourth switch being coupled to the main data line of the fourth memory block,
   wherein the second sense amplifier is coupled to the main data line of the second memory block via the main data line of the third and fourth memory blocks,
   wherein the first sense amplifier drive circuits drives the first sense amplifier at a first current when the first switch is turned OFF and the second, third, and fourth switches are turned ON,
   wherein the second sense amplifier drive circuits drives the second sense amplifier at a second current when the first switch is turned OFF and the second, third, and fourth switches are turned ON, and
   wherein the first current is smaller than the second current.

14. A semiconductor memory comprising a plurality of unit memory arrays,
   wherein each unit memory array including:
      a first sense amplifier;
      a first switch block;
      a first memory block located adjacent to the first switch block;
      a second switch block located adjacent to the first memory block;
      a second memory block located adjacent to the second switch block;
      a third switch block located adjacent to the second memory block; and
      a second sense amplifier,
   wherein each of the first and second memory blocks includes:
      a first data line extending in a first direction;
      a second data line in parallel to the first data line;
      a main data line in parallel to the first data line;
      a plurality of word lines crossing the first and second data lines and extending in a second direction; and
      a plurality of memory cells, each memory cell being placed at a predetermined crossing point of the plurality of word lines and the first and second data lines,
   wherein the first sense amplifier is coupled to the main data line of the first memory block,
   wherein the second sense amplifier is coupled to the main data line of the second memory block,
   wherein the first switch block includes a first switch coupling together the first data line and the main data line of the first memory block,
   wherein the second switch block includes:
      a second switch coupling together the second data line of the first memory block and the main data line of the second memory block;
   a third switch coupling together the main data line of the first memory block and the main data line of the second memory block; and
   a fourth switch coupling together the second data line of the second memory block and the main data line of the first memory block, and
   wherein the third switch block includes a fifth switch coupling together the first data line of the second memory block and the main data line of the second memory block.

15. A semiconductor memory according to claim 14,
   wherein each of the first and second data lines has a folded data line structure, and
   wherein the main data line is a complimentary pair of main data lines.

16. A semiconductor memory according to claim 15,
   wherein one side of the first switch block is adjacent to one side of the first memory block,
   wherein another side of the first memory block is adjacent to one side of the second switch block,
   wherein another side of the second switch block is adjacent to one side of the second memory block, and
   wherein another side of the second memory block is adjacent to one side of the third switch block.

17. A semiconductor memory according to claim 15,
wherein in the first memory block, one of the plurality of word lines selects a first memory cell at a crossing point of the first data line and a second memory cell at a crossing point of the second data line, and
wherein data of the first and second memory cells are amplified by the first and second sense amplifiers, respectively, by turning OFF the third switch and turning ON the first and second switches.

18. A semiconductor memory according to claim 17,
wherein during from a first timing when the one of the plurality of word lines selects the first memory cell to a second timing when the first and second sense amplifier are activated, the first switch is turned OFF in a predetermined period.

19. A semiconductor memory according to claim 17, wherein each of the first and second sense amplifiers have cross coupled P-type MOS transistors, and
wherein each of the first and second data lines are coupled to an amplifier having cross coupled N-type MOS transistors.

20. A semiconductor memory according to claim 17,
wherein each of the first and second data lines is coupled to a voltage-to-current conversion type sense amplifier.

21. A semiconductor memory according to claim 17,
wherein each of the plurality of memory cells comprises a MOS transistor and a capacitor.

22. A semiconductor memory according to claim 15, further comprising a plurality of column selection lines extending in the first direction,
wherein the first data line has a non-inverted first data line and a inverted first data line, the second data line having a non-inverted second data line and a inverted second data line, and the main data line having a non-inverted main data line and a inverted main data line,
wherein the non-inverted and inverted first data lines and the non-inverted and inverted second data lines are formed in a first wiring layer, and form four data lines,
wherein the non-inverted and inverted main data lines and the plurality of column selection lines are formed in a second wiring layer above the first wiring layer,
wherein a first width between the non-inverted and inverted main data lines is twice that of a second width between the nearest neighboring two of the four data lines, and
wherein a third width between nearest neighboring two of said plurality of column selection lines is at least three times that of the second width.

23. A semiconductor memory according to claim 15, further comprising a plurality of column selection lines extending in the first direction,
wherein the first data line has a non-inverted first data line and a inverted first data line, the second data line having a non-inverted second data line and a inverted second data line, and the main data line having a non-inverted main data line and a inverted main data line,
wherein the non-inverted and inverted first data lines and the non-inverted and inverted second data lines are formed in a first wiring layer, and form four data lines,
wherein the non-inverted and inverted main data lines are formed in a second wiring layer above the first wiring layer,
wherein the plurality of column selection lines is formed in a third wiring layer above the second wiring layer,
wherein a first width between the non-inverted and inverted main data lines is twice that of a second width between nearest neighboring two of the four data lines, and
wherein a third width between nearest neighboring two of said plurality of column selection lines is three times that of the second width.

24. A semiconductor memory comprising:
a plurality of unit memory arrays, each having:
a main data line which has a plurality of dividing nodes;
a plurality of data lines, each coupled to a plurality of memory cells and the main data line via a first switch;
a first sense amplifier coupled to one end of the main data line;
a second sense amplifier coupled to another end of the main data line; and
a plurality of second switches, each coupled to the main data line at each of the plurality of dividing nodes, and
first and second sense amplifier drive circuits coupled to power receiving nodes of the first and second sense amplifiers, respectively,
wherein one of the plurality of second switches is a separation switch being turned OFF so as to divide the main data line into two sections, and remaining ones of the plurality of second switches being turned ON, and
wherein the first sense amplifier drive circuit supplies a different current to the first sense amplifier depending on a position of the separation switch.

25. A semiconductor memory according to claim 24,
wherein said first sense amplifier drive circuit has a third switch and a fourth switch, each of which is coupled between the power receiving node of the first sense amplifier and a power source.

26. A semiconductor memory according to claim 25,
wherein the conductance of the third switch is lager than that of the fourth switch, and
wherein the third switch is turned ON in a first current supplying mode and the fourth switch is turned ON in a second current supplying mode.

27. A semiconductor memory comprising first and second unit memory arrays neighboring each other,
wherein each unit memory array includes:
a pair of main data lines having a plurality of dividing nodes;
a plurality of data lines, each being coupled to the pair of main data line via a first switch and coupled to a plurality of memory cells;
a first sense amplifier coupled to one end of the pair of main data lines;
a second sense amplifier coupled to another end of the pair of main data lines; and
a plurality of second switches, each being coupled to the pair of main data lines at each of the plurality of dividing nodes,
wherein the pair of main data lines of the first unit memory array is transposed at a plurality of first nodes,
wherein the pair of main data lines of the second unit memory array is transposed at a plurality of second nodes,
wherein the first nodes are shifted the second transpose nods by a half period, and
wherein each of said first and second unit memory arrays also includes means for equalizing noise between the first and second unit memory arrays.

28. A semiconductor memory according to claim 27,
wherein the equalizing means includes
a first pair of extended main data lines coupled to the one end of the pair of main data lines, and
a second pair of extended main data lines coupled to the another end of the pair of main data lines.

29. A semiconductor memory according to claim 28,
wherein one of the plurality of second switches is a separation switch which is turned OFF so as to divide the pair of main data lines into two sections, and remaining ones of the plurality of second switches are turned ON, and
wherein the first pair of extended main data lines of said first unit memory array compensates for noise from said second unit memory array when the separation switch is turned OFF.

30. A semiconductor memory according to claim 29,
wherein the first nodes are located on some of the plurality of dividing nodes, and
wherein the second transpose nodes are located on remaining ones of the plurality of dividing nodes.

31. A semiconductor memory according to claim 30,
wherein each of the plurality of second switches includes first and second MOS transistors which are coupled in series to each other.

32. A semiconductor memory according to claim 29,
wherein each of the first nodes is located between nearest neighboring two nodes of the plurality of dividing nodes, and
wherein each of the second nodes is located between nearest neighboring two nodes of the plurality of dividing nodes.

33. A semiconductor memory according to claim 32,
wherein each of the plurality of second switches includes first and second MOS transistors which are coupled in series to each other.

34. A semiconductor memory comprising first and second unit memory arrays neighboring each other,
wherein each unit memory array includes:
a first memory block;
a first sense amplifier adjacent to the first memory block;
a block adjacent to the first amplifier including a plurality of units, each unit including a second memory block, a switch block adjacent to second memory block, and a third memory block adjacent to the switch block;
a second sense amplifier adjacent to the block; and
a fourth memory block adjacent to the second memory block,
wherein each of the first, second, third, and fourth memory blocks includes a pair of main data lines, and a pair of data lines in parallel to the pair of main data lines to which a plurality of memory cells are coupled,
wherein the first sense amplifier is coupled to the pair of main data lines of the first memory block, and the pair of main data lines of the second memory block of one of the plurality of units which is nearest to the first memory block,
wherein the second sense amplifier is coupled to the pair of main data lines of the fourth memory block, and the pair of main data lines of the third memory block of one of the plurality of units which is nearest to the fourth memory block,
wherein the pair of main data lines of the second memory block are coupled to the pair of main data lines of the third memory block at a position in which the second memory block is adjacent to the third memory block,
wherein in each of the plurality of units, the switch block includes a pair of switches coupling together the pair of main data lines of the second memory block and the pair of main data lines of the third memory block,
wherein the plurality of units consists of odd-numbered units and even-numbered units as defined by their order of arrangement,
wherein in the even-numbered units of said first unit memory array, the pair of main data lines are transposed near the switch block or inside the switch block, and
wherein in the odd-numbered units of said second unit memory array, the pair of main data lines are transposed near the switch block or inside the switch block.

35. A semiconductor memory according to claim 34,
wherein the pair of main data lines of the first, second, third, and fourth memory blocks are similar in length.

36. A semiconductor memory according to claim 35,
wherein each of the pair of switches includes first and second MOS transistors which are coupled in series to each other.

37. A semiconductor memory comprising first and second unit memory arrays neighboring each other,
wherein each unit memory array includes:
a first memory block;
a first sense amplifier adjacent to the first memory block;
a block adjacent to the first amplifier including a plurality of units, each unit including a second memory block, a switch block adjacent to second memory block, and a third memory block adjacent to the switch block;
a second sense amplifier adjacent to the block; and
a fourth memory block adjacent to the second memory block,
wherein each of the first, second, third, and fourth memory blocks includes a pair of main data lines, and a pair of data lines in parallel to the pair of main data lines to which a plurality of memory cells are coupled,
wherein the first sense amplifier is coupled to the pair of main data lines of the first memory block, and the pair of main data lines of the second memory block of one of the plurality of units which is nearest to the first memory block,
wherein the second sense amplifier is coupled to the pair of main data lines of the fourth memory block, and the pair of main data lines of the third memory block of one of the plurality of units which is nearest to the fourth memory block,
wherein the pair of main data lines of the second memory block are coupled to the pair of main data lines of the third memory block at a position in which the second memory block is adjacent to the third memory block,
wherein in each of the plurality of units, the switch block includes a pair of switches coupling together the pair of main data lines of the second memory block and the pair of main data lines of the third memory block, wherein the plurality of units consists of odd-numbered units and even-numbered units as defined by their order of arrangement, wherein in said first unit memory array, the pair of main data lines of the first and fourth memory blocks are transposed near the first and second sense amplifiers, respectively wherein in said first unit memory array, the pair of main data lines are transposed near an interface between one of the odd-numbered units and one of the even-numbered units, and wherein in said second unit memory array, the pair of main data lines are transposed near an interface between one of the even-numbered units and one of the odd-numbered units.

38. A semiconductor memory according to claim 37, wherein the pair of main data lines of the first, second, third, and fourth memory blocks are similar in length.

39. A semiconductor memory according to claim 38, wherein each of the pair of switches includes first and second MOS transistors which are coupled in series to each other.

* * * * *